(12) United States Patent
Vyas et al.

(10) Patent No.: US 7,726,189 B2
(45) Date of Patent: Jun. 1, 2010

(54) NONLINEAR MICROMECHANICAL RESONATOR

(75) Inventors: Ashwin Vyas, Lafayette, IN (US); Anil K. Bajaj, West Lafayett, IN (US); Dimitrios Peroulis, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 11/809,070

(22) Filed: May 31, 2007

(65) Prior Publication Data

US 2008/0047346 A1 Feb. 28, 2008

Related U.S. Application Data

(63) Continuation-in-part of application No. 11/496,881, filed on Jul. 31, 2006.

(60) Provisional application No. 60/704,291, filed on Aug. 1, 2005.

(51) Int. Cl.
*G01H 13/00* (2006.01)
*H03H 9/00* (2006.01)
(52) U.S. Cl. .......................... 73/580; 333/186
(58) Field of Classification Search .................. 333/186; 331/154; 73/580
See application file for complete search history.

(56) References Cited

U.S. PATENT DOCUMENTS 3,525,884 A * 8/1970 Onoe et al. ................. 310/321

| 5,455,547 | A |  | 10/1995 | Lin et al. |
|---|---|---|---|---|
| 5,763,781 | A | * | 6/1998 | Netzer ..................... 73/504.16 |
| 6,393,913 | B1 |  | 5/2002 | Dyck et al. |
| 6,497,141 | B1 |  | 12/2002 | Turner et al. |
| 6,686,807 | B1 | * | 2/2004 | Giousouf et al. ............ 331/154 |

OTHER PUBLICATIONS

Balachandran, B. and Nayfeh, A.H.; "Nonlinear Motions of Beam-Mass Structure"; Nonlinear Dynamics 1:39-61; 1990; Kluwer Academic Publishers; Netherlands.

Rutzel, S.; Lee, S.I.; and Raman, A.; "Nonlinear Dynamics of Atomic-Force-Microscope Probes Driven in Lennard-Jones Potentials"; Proc. R. Soc. London 1-24; 2003; The Royal Society; London, United Kingdom.

Younis, M.I. and Nayfeh, A.H.; "A Study of the Nonlinear Response of a Resonant Microbeam to an Electric Actuation"; Nonlinear Dynamics 31:91-117; 2003; Kluwer Academic Publishers; Netherlands.

Nayfeh, A.H. and Mook, D. T.; "Nonlinear Oscillations"; Wiley Classics Library; 6.5:402-413.

Nayfeh, A.H. and Pai, P.F.; "Linear and Nonlinear Structural Mechanics"; Wiley Series in Nonlinear Science; 4.5:215-225.

(Continued)

*Primary Examiner*—Vibol Tan
(74) *Attorney, Agent, or Firm*—Brink Hofer Gilson & Lione

(57) ABSTRACT

A micromechanical resonator having an actuator configured to provide an excitation, a second component configured to move within a plane at a second frequency in response to the excitation of the actuator, and a first component coupled with the second component such that the movement of the second component at the second frequency induces resonant excitation of the first component that is substantially completely out of the plane.

16 Claims, 8 Drawing Sheets

OTHER PUBLICATIONS

Nayfeh, A.H.; "Nonlinear Interactions: Analytical, Computational and Experimental Methods"; Wiley Series in Nonlinear Science; 2:41-49.

Doedel, E.J. et al.; "Auto 97: Continuation and Bifurcation Software for Ordinary Differential Equations"; pp. 1-6, 2:10-13; Mar. 29, 1998.

Tilmans, H.A.C.; De Raedt, W.; and Beyne, E.; "MEMS for Wireless Communications: 'From RF-MEMS Components to RF-MEMS-SiP'"; Journal of Micromechanics and Microengineering 13:S139-S163; 2003; IOP Publishing Ltd., United Kingdom.

Bajaj, A.K.; Chang, S.I.; and Johnson, J.M.; "Amplitude Modulated Dynamics of a Resonantly Excited Autoparametric Two Degree-of-Freedom System"; Nonlinear Dynamics 5:433-457; 1994; Kluwer Academic Publishers; Netherlands.

Vyas, A.; Bajaj, A.K.; Raman, A; and Peroulis, D.; "Nonlinear Micromechanical Filters Based on Internal Resonance Phenomenon"; 4 pages.

Nguyen, C.T.C.; "Vibrating RF MEMS Technology: Fuel for an Integrated Micromechanical Circuit Revolution?"; Dig. Of Tech. Papers, the 13$^{th}$ Conf. on Solid-State Sensors & Actuators (Transducers '05) pp. 243-247; Jun. 5-9, 2005; Seoul, Korea.

Vyas, A. and Bajaj, A.K.; "Microresonators Based on 1:2 Internal Resonance"; ASME International Mechanical Engineering Congress and Exposition; Nov. 5-11, 2005; ASME; Orlando, FL, USA.

* cited by examiner

NONLINEAR MICROMECHANICAL RESONATOR

CROSS-REFERENCE TO RELATED APPLICATION

This patent application claims the benefit under 35 U.S.C. §120 of U.S. Non-Provisional patent application Ser. No. 11/496,881, filed Jul. 31, 2006 and entitled "NONLINEAR INTERNAL RESONANCE BASED MICROMECHANICAL RESONATORS", and U.S. Provisional Patent Application Ser. No. 60/704,291, filed Aug. 1, 2005 and entitled "NONLINEAR INTERNAL RESONANCE BASED MICROMECHANICAL RESONATORS", the entire contents of each of which are incorporated herein by reference.

BACKGROUND

1. Field of the Invention

The invention relates generally to a micromechanical resonator. More specifically, the invention relates to a nonlinear micromechanical resonator for use with a mass sensor.

2. Related Technology

Most mechanical microresonators utilize shift in natural frequency to sense mass. Such micro/nano mass sensors have been demonstrated for applications in biological and chemical environments. Mass sensitivity of resonance based sensors primarily depends on the quality factor, and the mass of the structure used as sensor. A mass sensor operating in vacuum performs better than in air as the frequency peak gets sharper with higher quality factor. Further, reducing the resonant structure from a micro-sized to a nano-sized resonator can result in improved mass sensitivity.

It is therefore desirable to design a microresonator that permits the user to utilize nonlinearities in the microresonator to determine the mass of objects.

SUMMARY

In overcoming the limitations and drawbacks of the prior art, the present invention provides a micromechanical resonator having an actuator configured to provide an excitation, a second component configured to move within a plane at a second frequency in response to the excitation of the actuator, and a first component coupled with the second component such that the movement of the second component at the second frequency induces resonant excitation of the first component that is substantially completely out of the plane.

In another aspect of the invention, a micromechanical resonator is provided including, a structure having a first component and a second component and an actuator configured to induce movement of the second component at a second frequency and substantially completely within a plane. The first component is coupled to the second component such that the movement of the second component at the second frequency induces resonant excitation of the first component that is substantially completely out of the plane.

In yet another aspect of the invention, a mass sensor is provided including, a micromechanical resonator and a measurement device. The micromechanical resonator includes a structure with a first component, a second component, and an actuator configured to induce movement of the second component at a second frequency and substantially completely within a plane. The first component is configured to receive the object, and the first component is coupled to the second component such that the movement of the second component at the second frequency induces resonant excitation of the first component substantially completely out of the plane. The measurement device is able to detect the resonant excitation of the first component to determine the mass of the object Further objects, features and advantages of this invention will become readily apparent to persons skilled in the art after a review of the following description, with reference to the drawings and claims that are appended to and form a part of this specification.

DETAILED DESCRIPTION

Figure 1:
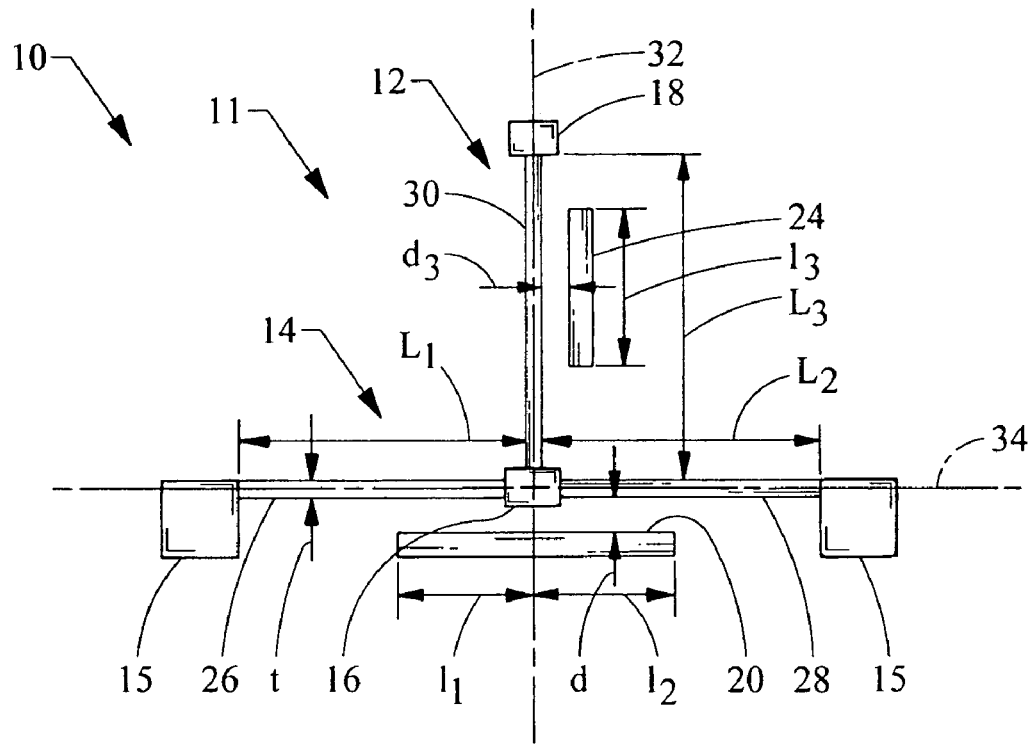
FIG. 1 shows a plan view of a micromechanical resonator embodying the principles of the present invention.

Referring now to the drawings, FIG. 1 is a schematic of a microresonator 10 according to a first embodiment of the present invention. The microstructure 10 generally includes a structure 11 defined by a first component 12 and a second component 14, a base 15 (or substrate) supporting the structure 11, a first mass 16 and a second mass 18 coupled with the structure 11, a first electrode 24 positioned adjacent to the first component 12, and a second electrode 20 positioned adjacent to the second component 12.

The second component 14 of the structure 11 includes a first horizontal beam 26 and a second horizontal beam 28, each having a first end connected to the base 15 and a second end connected to the first mass 16. Each of the horizontal beams 26, 28 may be connected to the base 15 that does not permit displacement or pivoting movement of the end of the beam 26, 28 at the base 15. Similarly, each horizontal beam 26, 28 may also be connected to the first mass 16 by a fixed connection. The horizontal beams 26, 28 shown in FIG. 1 both have equal or substantially equal specifications, such as length, width, thickness, diameter, and type of material, so the respective horizontal beams 26, 28 perform substantially identically when an external force is applied equally thereto.

The first component 12 of the structure 11 includes a vertical beam 30 coupled with the second component 14 of the structure 11 by the first mass 16. More specifically, one end of the vertical beam 30 may be connected to the midpoint of the first mass 16 so that the vertical beam 30 is centered along the length of the second component 14 and so that a vertical axis 32 of the first component 12 is generally perpendicular to a horizontal axis 34 of the second component 14. The other (free) end of the vertical beam 30 is connected to the second mass 18. The vertical beam 30 may be fixed to the first mass 16 by a fixed connection.

The second electrode 20 is an electrostatic electrode positioned adjacent to, and centered along the length of, the horizontal beams 26, 28. The second electrode 20 is connected to an electrical power supply that provides a bias voltage $V_b$ and a harmonically fluctuating voltage $V_{ac}$ sufficient, depending upon the quality factor determined by operating conditions, for selectively inducing resonance in the second component 14. For the structure with specific dimensions given below, and for a 1 um gap between the electrode 20 and the structure 26, 28 with quality factor Q=5000, Vproductthreshold=0.05V^2, that is $V_b$=5V, and $V_{AC}$=0.01V.

Figure 2:
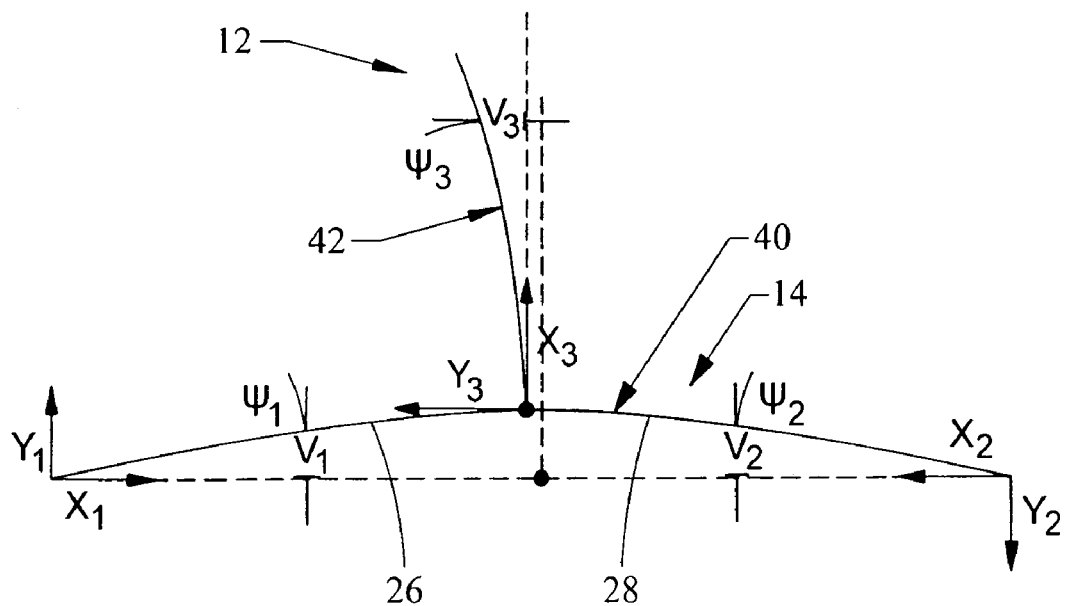
FIG. 2 is a schematic representation of the structure shown in FIG. 1, showing deflecting components of the structure with respect to a coordinate system.
Figure 4A:
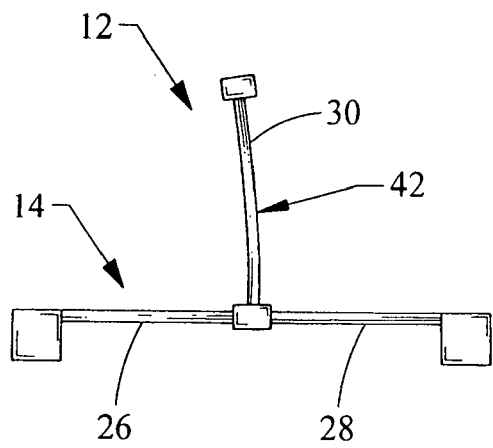
FIG. 4(a) is a schematic representation of the structure shown in FIG. 1 where the first mode is activated.
Figure 4B:
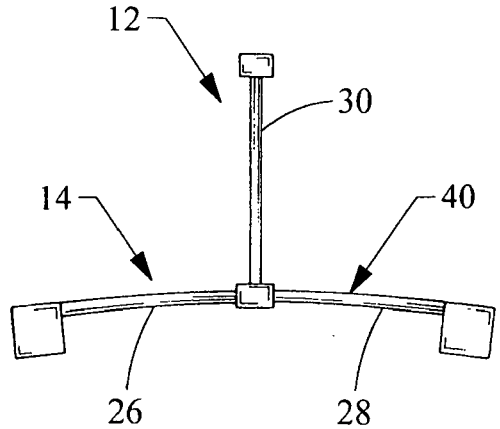
FIG. 4(b) is a schematic representation similar to FIG. 4(a), where the second mode is activated.

Upon activation of the second electrode 20, an electrostatic field is generated, thereby causing the second component 14 to deflect and define a second mode 40 (FIGS. 2 and 4(b)). As is known in the art, a mode is defined as the movement profile of an elastic body in which the body moves at a natural frequency. For example, the second (higher frequency) mode 40 defines a generally sinusoidal (in time) vertical deflection of the respective horizontal beams 26, 28 and displacement of the first mass 16 in response to the external force from the alternating current of the power supply. In this second mode, the vertical component 12 and the mass 18 also move axially along the axis 32 without flexing or deforming, as shown in FIG. 2. More specifically, the power supply causes the first mass 16 to move, and the horizontal beams 26, 28 to deflect, towards and away from the second electrode 20. Although for the specific design configuration of the present invention shown in FIG. 1, the second component 14 (see FIG. 1) embodies a single mode when the second electrode 20 is activated, the present invention may also be utilized in a microresonator in which a single physical component embodies two or more modes that are in 1:2 internal resonance.

When the input frequency of the power supply is not equal or approximately equal to a natural frequency of the higher mode of vibration (embodied in deflection of the second component 14), the amplitude of deflection of the second component 14 will be relatively low. Conversely, when the input frequency is equal or approximately equal to a natural resonance frequency of the second component 14, then the second component 14 will undergo resonance having a relatively high amplitude.

As a result of the deflection of the second component 14 in higher frequency mode of the microresonator, the first component 12 is likewise displaced along the vertical axis 32. More specifically, because each of the two horizontal beams 26, 28 deflects by an equal distance, the vertical beam 30 moves generally vertically along the vertical axis 32.

Similarly to the second electrode 20, the first electrode 24 is configured to generate an electrostatic field. This electrostatic field is able to detect disruptions in the electrostatic field caused by horizontal movement of the vertical beam 30. Thus, the first electrode 24 is able to detect deflection of the vertical beam 30 transverse to the vertical axis 32 (parallel to the horizontal axis 34). In an alternative configuration, the first electrode 24 operates to excite resonance in the lower frequency mode of the microresonator, which includes deflection of the first beam 12 while the second electrode 20 detects movement of the second beam 14. In another alternative design, a pair of electrodes is positioned adjacent to the second beam 30, one for exciting transverse (parallel to axis 34) movement of the second beam 30 and one for measuring the deflection of the second beam 30.

As mentioned above, when the second component 14 is not resonating, the first component 12 will undergo little or no deflection parallel to the horizontal axis 34. More specifically, when the second component 14 is not resonating, the first component 12 will remain generally straight and perpendicular to the first mass 16 so that the horizontal distance between the first beam 30 and the first electrode 24 remains relatively constant. As a result of the constant horizontal distance between the first beam 30 and the first electrode 24, the first electrode 24 will detect little or no change to the electrostatic field. Therefore, when the microresonator, and hence the second component 14, vibrates at a frequency other than a natural frequency, the second component 12 will not deflect horizontally. In other words, the higher frequency and the lower frequency natural modes, with specific examples shown in the form of modes 40, 42 in FIGS. 2, 4(a), and 4(b), are uncoupled with each other while the second component 14 vibrates at a frequency other than the higher (second) natural resonance frequency. This characteristic makes the structure 11 particularly useful as a filter because the first electrode 24 will detect little or no change in the electrostatic field adjacent to the first component 12 when the second component 14 is vibrating at a frequency other than the higher (second) natural frequency. Therefore, in this operational configuration, the microresonator 12 can be used to filter out all frequencies that are not very close to the higher natural frequencies of the microresonator, vibrating in second mode depicted in FIG. 4(b). In this higher mode, only the second component 14 flexes, as shown in FIG. 4(b).

Conversely, the first and second modes are substantially non-linearly coupled with each other while the second mode vibrates at a frequency approximately twice the natural frequency of the first mode. In other words, due to 1:2 internal resonance which is discussed further below, when the microresonator is resonating in the higher frequency mode at the natural frequency that is approximately 2 times larger than the natural frequency of a lower frequency mode of the microresonator, the first component 12 will undergo horizontal deflection due to resonance of the lower frequency mode, as signified by the mode 42 in FIG. 4(a). More specifically, the second (higher) mode 40 (as embodied by the second component 14 and the first component 12) excites the first (lower) mode 42 (as embodied by the first component 12 and the second component 14) and causes the first component 12 to resonate along the horizontal axis in addition to vertical displacement along the vertical axis 32 caused by the second mode 40. As the first component 12 is deflected parallel to the horizontal axis 34, the first electrode 24 is able to detect deflection of the first component 12, thereby permitting the microresonator 10 to serve as a sensing device, or a signal processing filtering device.

The lower and higher frequency modes (the first and second modes 42, 40) are coupled with each other through a phenomenon known as nonlinear modal interaction. Non-linear modal interaction is defined as the phenomenon where one mode (in this case, the second mode 40) excites another mode (in this case, the first mode 42) through non-linear interactions within the structure. The structure 11 utilizes modal interactions in the two modes that arise due to inertial quadratic nonlinearities. Non-linear modal interaction in structure 11 occurs when the respective modes have natural frequencies having a ratio of 1:2. For example, if the second mode 40 (FIG. 4(b)) has a natural frequency of (f) and the first mode 42 (FIG. 4(a)) has a natural frequency of (f/2), then resonant excitation of the microresonator in its second mode 40 at frequency (f) will induce resonance of the first mode at a frequency of (f/2). Experimental results show that non-linear modal interaction is most effective when the ratio of natural frequencies is 1:2±0.5% so long as the Q factor is sufficiently high, as will be discussed in more detail below.

In order for 1:2 resonance to occur between the respective modes, the first and second components 12, 14 must have a particular length ratio and/or weight ratio. More specifically, the first and second components 12, 14 and the masses 16, 18 must have a suitable combination of structural characteristics for 1:2 resonance to occur. As a first example, the first mass 16 has a weight equal to the weight of the first component 12, the second mass 18 has a weight equal to the combined weight of the horizontal beams 26 and 28), and the first component 12 has a length approximately equal to 108% (±2%) of one of the horizontal beams 26, 28. In an alternative design, where no additional masses (masses 16 and 18) are present and the first and second components 12, 14 each have the same thickness and are made of the same material, the first component 12 has a length approximately equal to 133% (±2%) of one of the horizontal beams 26, 28.

The above scenario describes non-linear modal interaction when the higher (second) frequency mode 40 (signified by flexing of the component 14) is excited by an external force (the second electrode 20). However, non-linear modal interaction may also occur when the lower (first) frequency mode 42 (signified by flexing of both the components 12 and 14) is resonantly excited by an external force (such as the first electrode 24), thereby inducing response of the second mode 40. More particularly, if the first electrode 24 excites the first (lower frequency) mode 42 at a natural frequency that is ½ as large as a natural frequency of the second (higher frequency) mode 40, then the second mode 40 will be induced by the first mode 42.

In the above-described scenarios, non-linear modal interaction occurs between the first and second modes. In a real working model, due to variables such as damping or an imprecise 1:2 frequency ratio, the external force that excites one of the modes may have to have a threshold amplitude in order for non-linear modal interaction to occur. For example, structural damping inherent to the structure 11 or air damping caused by components moving through the air may reduce the effectiveness of the non-linear modal interaction, thereby reducing the overall Quality of the system. Similarly, if the 1:2 ratio between the natural frequencies of the two modes is not within an acceptable error range (such as ±0.5%) then the effectiveness of the non-linear modal interaction may also be reduced. However, these system imperfections may be overcome by increasing the amplitude of the input voltage to the electrode.

Referring to FIGS. 1 and 2, mathematical models representing the above-described micromechanical resonator will now be discussed in more detail. The two horizontal beams 26, 28 have lengths denoted by L1, and L2 and the vertical beam 30 has a length denoted by L3. The first and second masses 16, 18 are denoted by $M_c$ and $M_t$ respectively. Because the microresonator works on the principle of 1:2 internal resonance, the linear analysis for this T-beam structure is performed to determine the design conditions under which any two modes of the microresonator, and more specifically the first and second modes, are tuned for 1:2 modal interaction. In the present analysis, the rotary inertia terms for the beams are neglected as we are interested in only the lower modes (first two modes) of the beam structure. The motion is assumed to be in the horizontal plane (no gravity). The rotary inertia of the rigid masses are taken into account without including the finiteness (to simplify analysis) of these rigid masses. The second electrode 20 is assumed to span the bottom beam partially and, $l_1$ and $l_2$ denote the span of the second electrode 20 over the horizontal beams 26, 28. The second electrode 20 is located at a distance d from the horizontal beams 26 and 28. The sensor electrode 24 has a length denoted by $l_3$ and is located at a distance $d_3$ from the vertical beam 30. As mentioned above, these electrodes can be used for sensing the beam response or actuating the resonator depending upon the mode (shape) to be excited.

The coordinate systems and displacements of beam segments are shown in FIG. 2. Axial and transverse displacements of a beam element in three beams 26, 28, 30 are denoted by $u_i$ and $v_i$, where i refers to the beam in consideration. The first horizontal beam 26 is beam 1, the second horizontal beam 28 is beam 2, and the vertical beam is beam 3. A Lagrangian description is used in modeling this T-beam structure and as a result these displacements are functions of undeformed arc length $s_i$. The displacements for the horizontal beams 26, 28 are with respect to the stationary substrate 15 and the displacements of the vertical beam 30 are measured with respect to the coordinate system located at the junction of the three beam segments 26, 28, 30. The rotation of a beam element is denoted by $\Psi_i(s_i,t)$. The shear deformation and warping are assumed to be negligible and thus, the rotations of elements are related to the beam displacements as follows:

$$\sin\psi_i = \frac{\partial v_i}{\partial s_i} \quad (1)$$

The kinetic energy T and potential energy V (including the electrostatic potential) of the system are given by:

$$T = \left\{ \sum_{i=1}^{2} \int_0^{L_i} \frac{1}{2} m_i (\dot{u}_i^2 + \dot{v}_i^2) ds_i \right\} + \\ \int_0^{L_3} \frac{1}{2} m_3 (\dot{u}_1 |_{s_1=L_1} - \dot{v}_3)^2 ds_3 + \\ \int_0^{L_3} \frac{1}{2} m_3 (\dot{v}_1 |_{s_1=L_1} + \dot{u}_3)^2 ds_3 + \\ \frac{1}{2} M_c (\dot{u}_1^2 |_{s_1=L_1} + \dot{v}_1^2 |_{s_1=L_1}) + \\ \frac{1}{2} J_c \dot{\psi}_1^2 |_{s_1=L_1} + \\ \frac{1}{2} M_t (\dot{u}_1 |_{s_1=L_1} - \dot{v}_3 |_{s_3=L_3})^2 + \\ \frac{1}{2} M_t (\dot{v}_1 |_{s_1=L_1} + \dot{u}_3 |_{s_3=L_3})^2 + \\ \frac{1}{2} J_t \dot{\psi}_3^2 |_{s_3=L_3} \quad (2)$$

and $$V = \sum_{i=1}^{3} \int_0^{L_i} \frac{1}{2} (EI)_i \left(\frac{\partial \psi_i}{\partial s_i}\right)^2 ds_i + \\ \sum_{i=1}^{2} \int_0^{L_i} \frac{1}{2} (EA)_i e_{i0}^2 ds_i - \\ \left( \int_{L_3-l_3}^{L_3} \frac{1}{2} \frac{\varepsilon_0 \varepsilon_r b_3}{d+v_3} (V_b + V\cos(\Omega t))^2 ds_3 \right) M_1 - \\ \left( \sum_{i=1}^{2} \int_{L_i-l_i}^{L_i} \frac{1}{2} \frac{\varepsilon_0 \varepsilon_r b_i}{d+v_i} (V_b + V\cos(\Omega t))^2 ds_i \right) M_2 \quad (3)$$

where a dot denotes derivative with respect to time. The variables $m_i$ and $(EI)_i$ denote the mass per unit length and flexural rigidity, respectively, for the ith beam. The rotary inertia of the masses $M_c$ and $M_t$ are $J_c$ and $J_t$ respectively. The variable $b_i$ denotes the width of the ith beam. When the second electrode 20 is used for actuation, the variables $M_1$ and $M_2$ in expression (3) take on the values $M_2=1$ and $M_1=0$. When the first electrode 24 is used for actuation, then $M_2=0$ and $M_1=1$. The strain along neutral axis in ith beam is denoted by $e_{i0}$. The strain $e_{i0}$ can also be expressed in terms of axial and transverse displacements as follows:

$$e_{i0} = \sqrt{\left(1+\frac{\partial u_i}{\partial s_i}\right)^2 + \left(\frac{\partial v_i}{\partial s_i}\right)^2} - 1 \quad (4)$$

The inextensibility assumption for vertical beam 30 results in the constraint $e_{30}=0$. In equation (3), the parameters $\in_0$ and $\in_r$ in the third term defining the electrostatic potential are permittivity of space ($8.8504\times10^{-12}$ F/m) and the relative permittivity of dielectric between the gap ($\in_r=1$ for air gap) respectively. The voltage applied between the second electrode 20 and the horizontal beams 26, 28 has a DC voltage part denoted by $V_b$ and an AC part with frequency $\Omega$ and voltage amplitude V.

The augmented Lagrangian L accounting for the constraints is then as follows:

$$L_{aug} = T - V + \\ \frac{1}{2}\int_0^{L_3} \lambda_1 \left(\left(1+\frac{\partial u_3}{\partial s_3}\right)^2 + \left(\frac{\partial v_3}{\partial s_3}\right)^2 - 1\right) ds_3 \quad (5)$$

where $\lambda_1$ is the Lagrange multiplier imposing the inextensibility constraint.

First, a linear analysis of the structure will be discussed by evaluating the structure with small, finite amplitude oscillations. The transverse displacements $v_i$ are scaled by a small dimensionless parameter $\in$. The axial displacements are assumed to be caused by transverse displacements and are of $O(\in^2)$. This essentially means that axial motion rigidity $(EA)_i$ is much larger than flexural rigidity (EI). These scalings are used to order nonlinear terms and only up to quadratic nonlinearities are retained in the present equations. As it will later turn out, the forcing will be scaled as $O(\in^2)$, and it will be seen that the effect of electrostatic actuation (including the non zero equilibrium position of the beam due to DC voltage) on linear natural frequencies will be of higher order. When retaining terms only up to the quadratic nonlinearities in the system (terms up to $O(\in^3)$), the electrostatic actuation will only result in change in static equilibrium position.

The linear equations of motion are obtained by introducing these scalings in Lagrangian, Equation (5), then retaining terms up to the order of $O(\in^2)$ and using Hamilton's principle. The non-dimensionalized linear equations of motion turn out to be as follows:

$$\ddot{\bar{v}}_i + \frac{\alpha_i}{r_i v_i^4} \frac{\partial^4 \bar{v}_i}{\partial \bar{s}_i^4} = 0, \quad (6)$$

where a dot now represents a derivative with respect to the non-dimensional time $\tau$. These non-dimensional parameters are defined as follows:

$$\bar{v}_i = \frac{v_i}{L}, \bar{s}_i = \frac{s_i}{L_i}, \alpha_i = \frac{(EI)_i}{EI} \\ r_i = \frac{m_i}{M}, v_i = \frac{L_i}{L}, \tau = \sqrt{\frac{EI}{ML^4}} t. \quad (7)$$

In defining these non-dimensional parameters of the system, M is a nominal mass per unit length, L is a nominal length, and EI is a nominal flexural rigidity. The arc length $s_i$ of the ith beam is nondimensionalized using the length of the corresponding beam. Thus, the equations of motion are valid over the region $0<\bar{s}<1$. Further, the transverse displacements are measured from the static equilibrium position of the beam which is changed due to electrostatic actuation. Thus, the formulation here assumes that the oscillations of the beam are about non-zero equilibrium position of the beam; however the non-zero equilibrium position effect on the natural frequencies are of higher order. The electrostatic potential terms are non-dimensionalized using the following scalings:

$$\left.\begin{aligned} g &= \frac{d}{L}, \bar{l}_i = \frac{l_i}{L_i} \\ F_0 &= \left(\frac{\varepsilon_0\varepsilon_r b_1}{g}\left(V_b^2 + \frac{V^2}{2}\right)\right) \Big/ (EI/L) \\ F_1 &= \left(\frac{\varepsilon_0\varepsilon_r b_1}{g}(2V_bV)\right) \Big/ (EI/L) \\ F_2 &= \left(\frac{\varepsilon_0\varepsilon_r b_1}{g}\left(\frac{V^2}{2}\right)\right) \Big/ (EI/L) \end{aligned}\right\} \quad (8)$$

where g is the non-dimensional gap between the structure and the stationary electrode, $\bar{l}_i$ is the non-dimensional span of the electrode over ith beam, $F_0$ relates to static force, $F_1$ and $F_2$ relate to harmonic forces with frequencies $\Omega$ and $2\Omega$ respectively.

Ideal clamp assumption at the two ends of the horizontal beam constrains the slope and displacement to be zero at $\bar{s}_1=0$ and $\bar{s}_2=0$. Also, the displacement of the upper beam is measured from the coordinate at the beginning of the upper beam and as a result the displacement $\bar{V}_3=0$ at $\bar{s}_3=0$. Apart from these five boundary conditions, the rest of the boundary conditions are as listed below:

$$\frac{\partial \bar{v}_1}{\partial \bar{s}_1}\bigg|_{\bar{s}_1=1} = \frac{v_2}{v_1}\frac{\partial \bar{v}_2}{\partial \bar{s}_2}\bigg|_{\bar{s}_2=1}, \quad (9)$$

$$\bar{v}_1|_{\bar{s}_1=1} = -\bar{v}_2|_{\bar{s}_2=1}, \quad (10)$$

$$\frac{\partial \bar{v}_1}{\partial \bar{s}_1}\bigg|_{\bar{s}_1=1} = \frac{v_3}{v_1}\frac{\partial \bar{v}_3}{\partial \bar{s}_3}\bigg|_{\bar{s}_3=0}, \quad (11)$$

$$\left.\begin{aligned} \frac{\alpha_1}{v_1^3}\frac{\partial^3 \bar{v}_1}{\partial \bar{s}_1^3}\bigg|_{\bar{s}_1=1} - \frac{\alpha_2}{v_2^3}\frac{\partial^3 \bar{v}_2}{\partial \bar{s}_2^3}\bigg|_{\bar{s}_2=1} = \\ ((1+R_t)r_3v_3 + \\ R_c(r_1v_1 + r_2v_2))\ddot{\bar{v}}_1|_{\bar{s}_1=1}, \end{aligned}\right\} \quad (12)$$

$$\left.\begin{aligned} \frac{\alpha_3}{v_3^2}\frac{\partial^2 \bar{v}_3}{\partial \bar{s}_3^2}\bigg|_{\bar{s}_3=0} - \frac{\alpha_1}{v_1^2}\frac{\partial^2 \bar{v}_1}{\partial \bar{s}_1^2}\bigg|_{\bar{s}_1=1} - \\ \frac{\alpha_2}{v_2^2}\frac{\partial^2 \bar{v}_2}{\partial \bar{s}_2^2}\bigg|_{\bar{s}_2=1} = \\ \frac{\gamma_c}{v_1}\frac{\partial^3 \bar{v}_1}{\partial \tau^2 \partial \bar{s}_1}\bigg|_{\bar{s}_1=1}, \end{aligned}\right\} \quad (13)$$

$$\frac{\alpha_3}{v_3^3}\frac{\partial^3 \bar{v}_3}{\partial \bar{s}_3^3}\bigg|_{\bar{s}_3=1} = R_t r_3 v_3 \ddot{\bar{v}}_3|_{\bar{s}_3=1}, \quad (14)$$

$$\frac{\alpha_3}{v_3}\frac{\partial^2 \bar{v}_3}{\partial \bar{s}_3^2}\bigg|_{\bar{s}_3=1} = -\gamma_t \frac{\partial^3 \bar{v}_3}{\partial \tau^2 \partial \bar{s}_3}\bigg|_{\bar{s}_3=1}, \quad (15)$$

where non-dimensional parameters $(R_t,\gamma_t)$ and $(R_c,\gamma_c)$, related to the rigid masses $M_c$ and $M_t$ respectively, as defined by:

$$\left.\begin{aligned} \gamma_t &= \frac{J_t}{ML^3}, R_t = \frac{M_t}{m_3L_3}, \\ \gamma_c &= \frac{J_c}{ML^3}, R_3 = \frac{M_c}{(m_1L_1+m_2L_2)}. \end{aligned}\right\} \quad (16)$$

Boundary condition in equation (9) ensures that the slopes of the two horizontal beams 26, 28 are equal at the junction of these beams 26, 28. Equation (10) constrains the bottom two beams to have the same transverse displacement at the junction. The negative sign in this equation appears as the coordinate system for the left and right bottom beams are different. Equation (11) constrains the vertical beam 30 to be perpendicular to the horizontal beams 26, 28 at the junction thereof.

The boundary conditions in equations (12) and (15) can be derived by either doing the force and moment balance at the junction or by introducing the geometric boundary conditions in equations (9)-(11) as constraints in the Lagrangian using three more Lagrange multipliers and then eliminating Lagrange multipliers to determine the boundary conditions. The shear forces due to bending in the horizontal beams 26, 28 support the inertial force due to the displacement of the first mass 16, the second mass 18, and the vertical beam 30. This force balance at the junction results in the boundary conditions (12) and similarly the moment balance at the junction gives boundary condition in equation (13). The boundary conditions in equations (14) and (15) correspond to the force and moment balance at the tip of the vertical beam 30.

The linear mode shapes and natural frequencies are obtained by assuming the solution to have the following form:

$$\bar{v}_i(\bar{s}_i,t) = V_i(\bar{s}_i)F(t), \quad (17)$$

where $V_i$ is a spatial dependent function and F(t) is a harmonic function with frequency at $\omega$. Substituting the assumed solution (17) into the governing equations (6), and separating space and time, we find that the following solution satisfies the governing equations:

$$\left.\begin{aligned} V_i(\bar{s}_i) = a_i\cos\beta_i\bar{s}_i + b_i\sin\beta_i\bar{s}_i + \\ c_i\cosh\beta_i\bar{s}_i + d_i\sinh\beta_i\bar{s}_i, \end{aligned}\right\} \quad (18)$$

where $\beta_i$ is given by:

$$\beta_i^4 = \frac{r_i v_i^4 \omega^2}{\alpha_i}. \quad (19)$$

The boundary conditions (at clamped ends and junction, and (9)-(15)) are used to now determine a characteristic matrix whose determinant is the characteristic equation. The roots of the characteristic equation determine natural frequencies ($\omega$) and linear mode shapes are subsequently obtained for these natural frequencies by using the characteristic matrix. Thus, the exact linear mode shapes are obtained analytically.

The purpose of introducing first and second masses 16, 18 in the analysis is to make the model flexible enough to achieve desired design objectives. More specifically, as discussed above, to achieve 1:2 resonance without the additional masses 16, 18, the length ratios of the first and second components 12, 14 must be approximately 0.66 to 0.68. Once it is decided to keep the rigid masses or not, the linear analysis presented here can be used to identify conditions for which the structure exhibits 1:2 internal resonance and to obtain mode shapes and natural frequencies. The example used in this paper to illustrate the results of the analysis (linear and nonlinear) does not include any rigid mass; however, the formulation includes the rigid mass to keep the analysis presented here relevant to designs requiring the use of rigid masses. Another example discussed above for a 1:2 internal resonance between the two lowest modes of the microresonator is: the first mass 16 has a weight equal to the weight of the first component 12, the second mass 18 has a weight equal to the combined weight of the horizontal beams 26 and 28), the first component 12 has a length approximately equal to 108% (±2%) of one of the horizontal beams 26, 28.

Now, consider the specific system with no rigid masses and all three beams having the same mass per unit length and flexural rigidity. Also, we assume that the lengths of the horizontal beams are equal, $L_1=L_2$ or $v_1=v_2$. Thus, the only parameter that is not fixed is the ratio of the length of vertical beam to the length of one of the bottom beams ($v_3/v_1$). Natural frequency is computed analytically for different values of the length ratio ($v_3/v_1$). We found that when the ratio of the length of upper beam to the length of one of the bottom beams is 1.3266, the second natural frequency is twice that of the first natural frequency. This provides us with an important design condition to have 1:2 internal resonance. This critical ratio is denoted by $$\left(\frac{v_3}{v_1}\right)_c,$$

with $$\left(\frac{v_3}{v_1}\right)_c = 1.3266.$$

An ANSYS FEM model of T-beam structure is used to verify the above non-dimensional linear analysis. Beam elements are used in modeling the structure in ANSYS. As for the linear analysis, electrostatic actuation effects are considered of higher order, the FEM model also does not include electrostatic actuation. The dimensions of the structure with material properties of polysilicon are as follows:

$$\left.\begin{array}{ll} L_1 = 30 \text{ μm}, & L_3 = 30\frac{v_3}{v_1} \text{ μm}, \\ E_1 = 150 \times 10^9 \text{ N/m}^2, & b_1 = 3 \text{ μm}, \\ I_1 = 0.84375 \text{ (μm)}^4, & m_1 = 0.010485 \frac{\text{Kg}}{\text{(μm)}}. \end{array}\right\} \quad (20)$$

Figure 3:
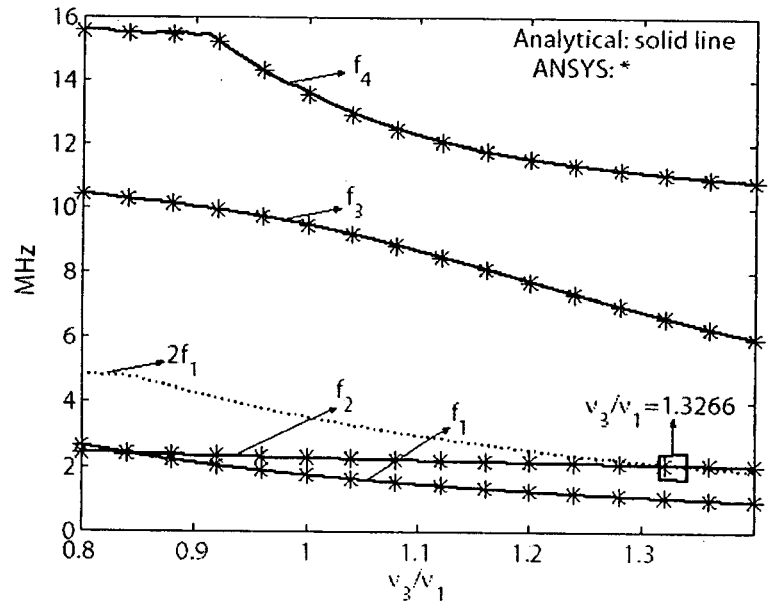
FIG. 3 is a graphical representation of natural frequencies of the micromechanical resonator shown in FIG. 1 as a function of the length ratio of the beam segments for a particular set of values.

Also, all the beams have the same cross-sectional area and are made of the same material. The first four natural frequencies for this system for different values of the length ratio $v_3/v_1$ are shown in FIG. 3. The analytically computed mode shapes for the critical length $$\left(\frac{v_3}{v_1}\right)_c = 1.3266$$

are shown in FIG. 4. In the first (or the lower frequency) mode (mode 42), the horizontal beam moves very little as compared to the vertical beam. However, in the second mode (mode 40), the transverse displacement of the upper beam is zero. Due to the nature of the modes, note that the response in the second mode will not result in any deflection of vertical beam, unless energy is transferred from second mode to the first mode through 1:2 internal resonance. The nonlinear responses of the structure with 1:2 internal resonance between the first two modes are presented in the next section for two cases of resonant excitations: (a) the resonant excitation of the first mode, and (b) the resonant excitation of the second mode.

The electrostatic actuation terms are scaled such that they are of $O(\in^2)$ as follows:

$$F_j = \in^2 \hat{F}_j \quad (21)$$

where j=0,1,2. This ordering ensures that the nonlinear terms in the Lagrangian and resonant excitation are at the same order in the analysis. The frequency of the first two modes of the structure are related to the actuation voltage frequency $\Omega$ as follows:

$$\Omega = R_1 \omega_1 (1 + \in \sigma_1), \quad (22)$$

$$\Omega = R_2 \omega_2 (1 + \in \sigma_2), \quad (23)$$

where $\omega_i$ is the ith natural frequency of the structure, $\sigma_1$ and $\sigma_2$ are the external detunings from perfect resonant excitation of either the first mode or the second mode. $R_1$ and $R_2$ determine the mode in primary resonance. Specifically, for $R_1=1$ and $R_2=\frac{1}{2}$, the first mode is in resonance and for $R_1=2$ and $R_2=1$, the second mode is in resonance. In using these tuning criteria we have assumed that the DC voltage, $V_b$ is not zero. From equation (8), if the bias voltage is zero the actuation term with frequency $\Omega$ will be zero as well. In order to actuate the first (second) mode for the case of zero DC voltage, the frequency of the AC voltage should be tuned to half of the first (second) modes natural frequency. Since the AC signal for RF applications is very small, a DC voltage is used in most of the applications. Thus, there will be a higher harmonic at two times the natural frequency of the second mode. An ideal design will avoid any 1:2:4 resonance between the first three modes of the system so that the third mode is not excited from the higher harmonic present in the actuation.

FIG. 3 shows the first four natural frequencies, $$f_i = \frac{\omega_i}{2\pi},$$

of the T-beam structure as a function of the length ratio ($L_3/L_1$) or ($v_3/v_1$). The T-beam structure parameters are: no rigid masses ($R_c=\gamma_c=R_t=\gamma_t=0$), equal mass per unit lengths ($r_1=r_2=r_3$), equal flexural rigidities ($\alpha_1=\alpha_2=\alpha_3$), equal lengths of the horizontal beams ($v_1=v_2$). The solid line denotes analytically computed frequencies and the symbol "*" denotes frequencies computed using FEM ANSYS model of the structure. FIG. 4 shows the first two modes of the T-beam structure when the length ratio ($L_3/L_1$) or ($v_3/v_1$)= .3266.

We can use the external detunings to relate the two natural frequencies up to $O(\in)$ as follows:

$$\omega_2 = 2\omega_1(1+\in\sigma_1) \quad (24)$$

where $$\sigma_1 = \sigma_1 - \sigma_2. \quad (25)$$

Here, $\sigma_1$ is the internal mistuning between the first two natural frequencies from exact 1:2 resonance. The internal resonance between the two modes result in modal interaction between the first and second modes when either of the modes are directly excited by electrostatic actuation. Thus, there will be a nonzero response of both the first and second modes in steady state when either of the modes are excited directly. In comparison, the responses of other modes (which are not coupled by internal resonances) can be decaying due to damping in the structure. Thus, the displacements of the beam are approximated using the first two internally resonant modes, as follows:

$$\bar{v}_i = \in (A_1\phi_{1i} + A_2\phi_{2i}) \tag{26}$$

$$\bar{u}_i = \in^2 (A_1^2 \eta_{11i} + A_2^2 \eta_{22i} + 2A_1A_2\eta_{12i}) \tag{27}$$

where $A_i$ are functions of time, $\phi_{1i}$ and $\phi_{2i}$ are the modal responses of the ith beam in first and second modes and are functions of the spatial coordinate $\bar{s}_i$. The variables $\eta_{jki}$ are also functions of the spatial coordinate $\bar{s}_i$. The eigenfunctions are determined by obtaining $V_i$ using equation (18) and the associated characteristic matrix for the linear system. The axial displacements are of order $O(\in^2)$ and are assumed to be caused by transverse displacements. This particular form of the axial displacement is motivated by the form of axial displacements in cantilever and clamped-clamped beam problems. The spatial form of the axial displacement of the ith beam is captured by $\eta_{jki}$.

The spatial function for the vertical beam (beam 30) axial displacement, $\eta_{jk3}$, is obtained by writing Lagrangian using the expressions in equation, retaining quadratic nonlinearities (terms up to $O(\in^3)$), and then requiring L to be stationary with respect to the Lagrange multiplier $\lambda_1$. The spatial functions for beams 26 and 28 axial displacements, $\eta_{jk1}$ and $\eta_{jk2}$, are determined by including cubic nonlinearities (terms up to $O(\in^4)$) in the Lagrangian and then neglecting inertia of the axial displacements. This process of neglecting inertia due to axial displacement is similar to the one used in the process of obtaining axial displacements in terms of, transverse displacement in clamped-clamped beam problem. Because the dynamics of the 1:2 internally resonant beam structure to the first order can be captured by retaining quadratic nonlinearities, the details of finding spatial functions are not provided here. The spatial functions obtained using the above approach are given by:

$$\eta_{jk1} = -\frac{1}{2v_1}\left[\int_0^{\bar{s}_1}\left(\frac{\partial\phi_{j1}}{\partial\bar{s}_1}\right)\left(\frac{\partial\phi_{k1}}{\partial\bar{s}_1}\right)d\bar{s}_1 - \frac{v_1}{v_1+v_2}\left(\sum_{i=1}^{2}\int_0^1\frac{v_1}{v_i}\left(\frac{\partial\phi_{j1}}{\partial\bar{s}_i}\right)\left(\frac{\partial\phi_{k1}}{\partial\bar{s}_i}\right)d\bar{s}_i\right)\bar{s}_1\right] \tag{28}$$

$$\eta_{jk2} = -\frac{1}{2v_1}\left[\frac{v_1}{v_2}\int_0^{\bar{s}_2}\left(\frac{\partial\phi_{j2}}{\partial\bar{s}_2}\right)\left(\frac{\partial\phi_{k2}}{\partial\bar{s}_2}\right)d\bar{s}_2 - \frac{v_2}{v_1+v_2}\left(\sum_{i=1}^{2}\int_0^1\frac{v_1}{v_i}\left(\frac{\partial\phi_{ji}}{\partial\bar{s}_i}\right)\left(\frac{\partial\phi_{ki}}{\partial\bar{s}_i}\right)d\bar{s}_i\right)\bar{s}_2\right] \tag{29}$$

$$\eta_{jk3} = -\frac{1}{2v_3}\int_0^{\bar{s}_3}\left(\frac{\partial\phi_{j3}}{\partial\bar{s}_3}\right)\left(\frac{\partial\phi_{k3}}{\partial\bar{s}_3}\right)d\bar{s}_3 \tag{30}$$

where (j,k) can take values (1,1), (2,2) or (1,2).

Small changes in system parameters (like lengths of the beam segments, additional mass) can also mistune the system from perfect 1:2 internal resonance. To model this, we introduce mistunings in lengths from critical length ratios, and masses for 1:2 internal resonance. The mistunings are defined as follows:

$$\frac{v_3}{v_1} = \left(\frac{v_3}{v_1}\right)_c (1+\varepsilon\sigma_L), \quad R_t = (R_t)_c + \varepsilon\hat{R}_t,$$
$$R_c = (R_c)_c + \varepsilon\hat{R}_c, \quad \gamma_t = (\gamma_t)_c + \varepsilon\hat{\gamma}_t, \tag{31}$$
$$\gamma_c = (\gamma_c)_c + \varepsilon\hat{\gamma}_c.$$

The parameters denoted as $(\ )_c$ represent design parameters for which the structure exhibits perfect 1:2 internal resonance. $\sigma_L$ represents mistuning in the length ratio $$\frac{v_3}{v_1}, \hat{R}_t$$

and $\hat{R}_c$ represent mistunings in the tip mass and central mass respectively and $\hat{\gamma}_t$ and $\hat{\lambda}_c$ represent mistunings in the rotary inertias of the tip mass and central mass, respectively.

The weak nonlinear response of the structure is obtained by averaging the Lagangian over the time period $Tp = 4\pi/\Omega$ of the primary oscillation or the fast time scale. The evolution of modal amplitudes and phases over slow time scale are determined using the averaged Lagrangian method. To explicitly introduce the slow time variables, the time dependent ith modal amplitude, $A_i$, is assumed to be of the following form:

$$A_i = p_i \cos\left(\frac{1}{R_1}i\Omega\tau\right) + q_i \sin\left(\frac{1}{R_1}i\Omega\tau\right) \tag{32}$$

where the $p_i$ and $q_i$ are quantities dependent on slow time scale $T_1 = \in\tau$. The derivative of $A_i$ is as follows:

$$\dot{A}_i = \frac{1}{2}i\Omega\left(-p_i\sin\left(\frac{1}{2}i\Omega\tau\right) + q_i\cos\left(\frac{1}{2}i\Omega\tau\right)\right) + \varepsilon\left(p_i'\cos\left(\frac{1}{2}i\Omega\tau\right) + q_i'\sin\left(\frac{1}{2}i\Omega\tau\right)\right) \tag{33}$$

where a prime denotes derivative with respect to the slow time scale $T_i$. Recall that a dot denotes derivative with respect to the fast time scale $\tau$.

Using the above assumptions, and substituting the mistunings in equations (31), (22), and (23), displacements in equations (26) and (27), modal amplitudes in equation (32), and nondimensional parameters introduced in equations (7), (8), and (16) into the augmented Lagrangian, equation (5), and retaining terms up to $O(\in^3)$ results in the following:

$$L_{aug} = \left(\frac{EI}{L}\right)(\mathcal{L} + O(\varepsilon^4)). \tag{34}$$

The Lagrangian L depends only on non-dimensional parameters. Because the transverse displacements are measured from the static equilibrium, the electrostatic term with $F_0$, equation (8), will not appear in the Lagrangian. Also, given the way we have defined the axial displacement of beam 30, equation (30), the term with Lagrange multiplier $\lambda_1$ is zero. The averaged Lagrangian over the period $Tp = 4\pi/\Omega$ is given by:

$$\langle \mathcal{L} \rangle = \frac{1}{T_p} \int_0^{T_p} \mathcal{L} d\tau \qquad (35)$$

$$= \varepsilon^2 \left[ \frac{r_1 v_1}{2} \left( \sum_{j=1}^2 \Gamma_j \bigg|_{\varepsilon=0} \frac{1}{2} \left(\frac{j\Omega}{R_1}\right)^2 (p_j^2 + q_j^2) \right) - \right.$$

$$\frac{\alpha_1}{2v_1^3} \left( \sum_{j=1}^2 \Gamma_{2+j} \bigg|_{\varepsilon=0} \frac{1}{2}(p_j^2 + q_j^2) \right) + (\bar{l}_1 + \bar{l}_2) \frac{\hat{F}_0}{2} \right] +$$

$$\varepsilon^3 \frac{r_1 v_1}{2} \left[ \sum_{j=1}^2 \frac{\partial \Gamma_j}{\partial \varepsilon} \bigg|_{\varepsilon=0} \frac{1}{2} \left(\frac{j\Omega}{R_1}\right)^2 (p_j^2 + q_j^2) - \right.$$

$$\left( \sum_{j=1}^2 \Gamma_j \bigg|_{\varepsilon=0} \frac{j\Omega}{R_1} (p_j q_j' - q_j p_j') \right) -$$

$$2(N_1 + (R_t)_c N_2) \left(\frac{\Omega}{R_1}\right)^2 \left( p_1 q_1 q_2 + \frac{1}{2}(p_1^2 - q_1^2) p_2 \right) -$$

$$\frac{\alpha_1}{r_1 v_1^4} \left( \sum_{j=1}^2 \frac{\partial \Gamma_{2+j}}{\partial \varepsilon} \bigg|_{\varepsilon=0} \frac{1}{2}(p_j^2 + q_j^2) \right) -$$

$$\frac{1}{2} \frac{\hat{F}_1}{gr_1} \{ (\Gamma_{f1} p_1 \Delta_1 + \Gamma_{f2} p_2 \Delta_2) M_2 +$$

$$(\Gamma_{f3} p_1 \Delta_1 + \Gamma_{f4} p_2 \Delta_2) M_1 \} \right]$$

where $\Gamma_j$, $N_1$, $N_2$ and $\Gamma_{fj}$ ($j=1, 2, 3, 4$) are defined in Appendix. $\Delta_1=1$ when the first mode is in the primary resonance and zero when the second mode is in the primary resonance. Similarly, $\Delta_2=1$ when the second mode is excited and zero when the first mode is excited. Although we only explicitly account for mistunings related to the parameters in equation (31), the Lagrangian formulated above can also account for mistunings in the variations in mass per unit lengths $r_i$, flexural rigidities $\alpha_i$, and bottom beam length ratio $v_2/v_1$. These variations will also result in mistuning the first two modes of the structure away from 1:2 internal resonance. The terms up to $O(\varepsilon^2)$ represent linear terms and so the stiffness and inertia terms are related as follows:

$$\left. \begin{array}{l} \frac{\alpha_1}{r_1 v_1^4} \Gamma_3 \bigg|_{\varepsilon=0} = \omega_1^2 \Gamma_1 \bigg|_{\varepsilon=0}, \\ \frac{\alpha_1}{r_1 v_1^4} \Gamma_4 \bigg|_{\varepsilon=0} = \omega_2^2 \Gamma_2 \bigg|_{\varepsilon=0}. \end{array} \right\} \qquad (36)$$

We substitute equation (36) and equations (22) and (23), in to equation (35) and then use the extended Hamilton's principle to derive Euler-Lagrange equations of motion. The resulting equations of motion, including the effect of the scaled modal damping ($\hat{\xi}_i$) for ith modes are:

$$\left. \begin{array}{l} p_1' = -\bar{\sigma}_1 \omega_1 q_1 - \hat{\xi}_1 \omega_1 p_1 + \omega_1 \Lambda_1 (p_1 q_2 - q_1 p_2), \\ q_1' = \bar{\sigma}_1 \omega_1 p_1 - \hat{\xi}_1 \omega_1 q_1 - \omega_1 \Lambda_1 (p_1 p_2 + q_1 q_2) - E_1, \\ p_2' = -\bar{\sigma}_2 \omega_2 q_2 - \hat{\xi}_2 \omega_2 p_2 + 2\omega_1 \Lambda_2 p_1 q_1, \\ q_2' = \bar{\sigma}_2 \omega_2 p_2 - \hat{\xi}_2 \omega_2 q_2 - \omega_1 \Lambda_2 (p_1^2 - q_1^2) - E_2, \end{array} \right\} \qquad (37)$$

where

-continued $$\bar{\sigma}_j = \sigma_j + \frac{1}{2\omega_j^2 \Gamma_j |_{\varepsilon=0}} \left[ \left( \omega_j^2 S_{1j} - \frac{\alpha_1}{r_1 v_1^4} S_{2j} \right) \sigma_L + \right. \qquad (38)$$

$$\left. \omega_j^2 (S_{3j} \hat{R}_t + S_{4j} \hat{R}_c + S_{5j} \hat{\gamma}_t + S_{6j} \hat{\gamma}_c) \right],$$

$$E_1 = \frac{1}{4} \frac{\hat{F}_1}{gr_1 \omega_1 \Gamma_1 |_{\varepsilon=0}} (\Gamma_{f1} M_2 + \Gamma_{f3} M_1) \Delta_1,$$

$$E_2 = \frac{1}{4} \frac{\hat{F}_1}{gr_1 \omega_2 \Gamma_2 |_{\varepsilon=0}} (\Gamma_{f2} M_2 + \Gamma_{f4} M_1) \Delta_2,$$

$$\Lambda_1 = \frac{(N_1 + (R_t)_c N_2)}{\Gamma_1 |_{\varepsilon=0}}, \quad \Lambda_2 = \frac{(N_1 + (R_t)_c N_2)}{4 \Gamma_2 |_{\varepsilon=0}},$$

$$S_{1j} = \frac{\partial^2 \Gamma_j}{\partial \varepsilon \partial \sigma_L} \bigg|_{\varepsilon=0}, \quad S_{2j} = \frac{\partial^2 \Gamma_{2+j}}{\partial \varepsilon \partial \sigma_L} \bigg|_{\varepsilon=0},$$

$$S_{3j} = \frac{\partial^2 \Gamma_j}{\partial \varepsilon \partial \hat{R}_t} \bigg|_{\varepsilon=0}, \quad S_{4j} = \frac{\partial^2 \Gamma_j}{\partial \varepsilon \partial \hat{R}_c} \bigg|_{\varepsilon=0},$$

$$S_{5j} = \frac{\partial^2 \Gamma_j}{\partial \varepsilon \partial \hat{\gamma}_t} \bigg|_{\varepsilon=0}, \quad S_{6j} = \frac{\partial^2 \Gamma_j}{\partial \varepsilon \partial \hat{\gamma}_c} \bigg|_{\varepsilon=0}.$$

The actual modal damping, $\xi_i$, of the ith mode is related to the scaled damping, ($\hat{\xi}_i$), as follows:

$$\xi_i = \varepsilon \hat{\xi}_i. \qquad (39)$$

The $\bar{\sigma}_i$ in averaged equations (37) represents the effective external mistuning of the ith mode. This effective mistuning includes the sensitivities $S_{ji}$ of different structure parameters as given in the equation (38). An effective internal mistuning of the two modes from 1:2 internal resonance, $\bar{\sigma}_i$, can thus be written as follows:

$$\bar{\sigma}_i = \bar{\sigma}_1 - \bar{\sigma}_2. \qquad (40)$$

The averaged equations (37) obtained here are identical to the averaged equations obtained for quadratically coupled internally resonant oscillators when excited externally in the first or second mode. These quadratically coupled oscillators are studied by many researchers for equilibrium solutions and bifurcations resulting in complex dynamics.

Response of an Illustrative Structure

Consider the T-shaped structure discussed while illustrating the results of linear analysis. The specific nominal T-beam structure had no rigid masses, and all the three beam segments have the same mass per unit lengths and the same flexural rigidities for all the beams. Further, the lengths and widths of the two bottom beams are equal. We choose nominal parameters as the parameters of the bottom left beam, the beam 26. These assumptions are written in terms of parameter values defined in the equations (7) and (16), as follows:

$$\left. \begin{array}{l} r_j = 1, \quad \alpha_j = 1, \quad v_1 = 1, \quad v_2 = 1, \\ (R_c)_c = 0, \quad (R_t)_c = 0, \quad (\gamma_c)_c = 0, \quad (\gamma_t)_c = 0, \\ v_3 |_c = 1.3266, \end{array} \right\} \qquad (41)$$

where $j=1, 2, 3$. The non-dimensional natural frequencies of the system obtained by linear analysis are as follows:

$$\omega_1 = 1.699, \quad \omega_2 = 3.398. \qquad (42)$$

The first two mode shapes are computed analytically and the mode shapes are normalized to have $\Gamma_1|_{\varepsilon=0} = \Gamma_2|_{\varepsilon=0} = 1$.

The microresonator structure's actual dimension are assumed to be the same as specified in equation (20). The gap between the horizontal beams 26, 28 and the second electrode 20 is fixed at d=1 μm. The gap between the vertical beam 30 and the first electrode 24 is also fixed at $d_3$=1 μm. All these dimensions are chosen keeping in mind the fabrication constraints. Using the permittivity of air and the mode shapes, the different terms defining forcing term reduces to just a function of applied voltage, as given below:

$$\left(\frac{1}{4}\frac{\hat{F}_1}{gr_1}\right) = \frac{2.837 V_b V}{\varepsilon^2} \times 10^{-6}, \quad \Gamma_{f1} = \Gamma_{f4} = 0, \\ \Gamma_{f2} = 0.421, \qquad\qquad \Gamma_{f3} = 0.868 \qquad (43)$$

The parameters in the above equation (43) suggest that, to the first order approximation, the first mode cannot be excited directly by using the second electrode 20, and similarly the second mode cannot be directly excited by the first electrode 24. This filtering of the first mode frequency when actuating by the second electrode 20 (and second mode frequency when actuating by the first electrode 24) is due to the mode shape of the system. This filtering characteristic will also be valid in general for microresonator structures as long as the symmetry of the structure is maintained.

The other parameters required to compute all the coefficients in the averaged equations (37) for this system are as follows:

$$\begin{aligned} S_{11} &= 0.998, & S_{21} &= 33.989, & S_{31} &= 3.714, \\ S_{41} &= 0, & S_{51} &= 2.602, & S_{61} &= 0.101, \\ S_{12} &= 0.6357, & S_{22} &= 0, & S_{32} &= 0.636, \\ S_{42} &= 0.958, & S_{52} &= 0, & S_{62} &= 0 \\ \Lambda_1 &= 0.7634, & \Lambda_2 &= 0.1908. \end{aligned} \qquad (44)$$

The parameters $S_{ij}$ determine the sensitivity of jth natural frequency to changes in different parameters, see Equation (38). The values of $S_{11}$ and $S_{21}$ suggest that the first mode is very sensitive to any changes in the length ratio ($v_3/v_1$). However, attaching a central rigid mass, parameter $S_{41}$, does not affect the natural frequency of the first mode. The parameters $S_{52}$ and $S_{62}$ suggest that the rotational inertia of the rigid masses do not affect the second mode natural frequency. $\Lambda_1$ and $\Lambda_2$ represent the strength of nonlinear coupling between the two modes.

The quality factor Q (as traditionally defined for liner systems) for the response of a microresonator in ith mode is ($\frac{1}{2}\zeta_i$), where $\zeta_i$ is the modal damping for ith mode. Since, quality factor is an important performance parameter for a microresonator, we compute the response of this structure for different values of damping coefficients. The structure is assumed to have perfect internal resonance, $\bar{\sigma}_1$=0, and the effects of different parameter sensitivities on the response are not discussed here. For a given excitation voltage and excitation in either mode, the decrease in damping of the first and second mode can result in Hopf bifurcations and thereby period doubling bifurcations and chaotic motions of the beam. The internal mistuning of the first two modes from 1:2 internal resonance also plays a critical role in determining the existence of Hopf bifurcation in the system dynamics. If the two modes are in perfect internal resonance, the system will not have any Hopf bifurcation when the second mode is excited directly. However, when the first mode is excited directly ($\Delta_1$=1); the system with the two modes in perfect internal resonance can still undergo Hopf bifurcation.

Figure 5A:
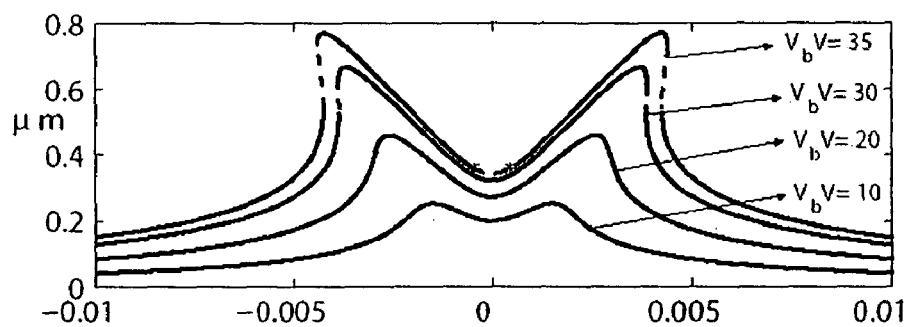
FIG. 5(a) is a graphical representation of the displacement of the tip of the vertical beam of the T-beam structure shown in FIG. 1 as a function of the excitation frequency, where the first mode is in the primary resonance.
Figure 5B:
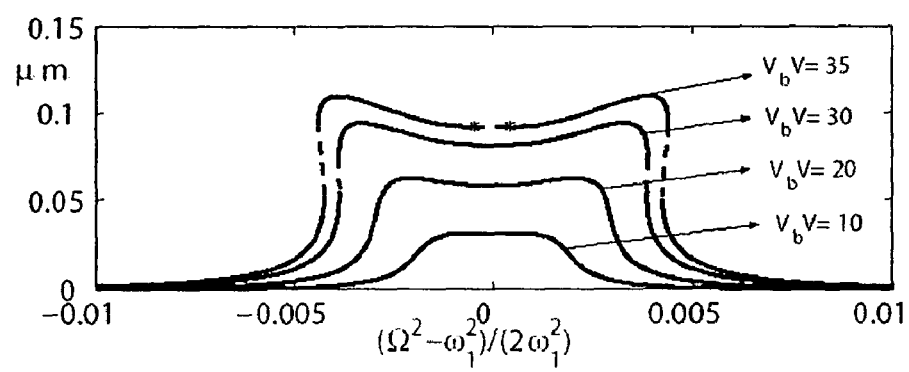
FIG. 5(b) is a graphical representation of the vertical displacement of the junction of the three beams of the T-beam structure shown in FIG. 1 as a function of the excitation frequency, where the first (lower frequency) mode is directly excited by external means and is in primary resonance.

The response of the structure is simulated in bifurcation and continuation software AUTO with scaling parameter $\in$=0.01 to scale the response to O(l). First, we consider a structure with low quality factor Q=500 for both the modes, and thus fix the value of damping parameters, $\zeta_1$ and $\zeta_2$, to 0.001. The scaled modal damping is then obtained using equation (39). The response obtained using AUTO is then scaled back to the actual beam displacements using equations (7), (16), and (27). When the structure is excited directly in the first mode, the structure is actuated using the first electrode 24. For the direct excitation of the second mode, the second electrode 20 is used for actuation. FIG. 5 shows the response for the primary resonance of the first mode in terms of the displacements at the tip of the upper beam for first mode (FIG. 5(a)) and at the junction of the three beams for second mode (FIG. 5(b)) for different input voltages. The modal response thus plotted is the maximum displacement of the structure in that particular mode. The response undergoes Hopf-bifurcation for higher voltages. When the first mode is directly excited, the response in both the modes remains non-zero over the entire bandwidth of interest. The sensor output signal at the second electrode 20 is at double the input frequency and also act as a mixer (upconversion) and filter for the input signal.

Figure 6A:
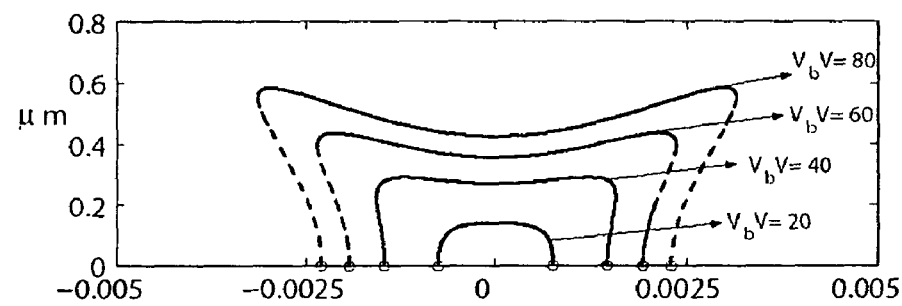
FIG. 6(a) is a graphical representation similar to FIG. 5(a), where the second (higher frequency) mode is directly excited by external actuation and is in the primary resonance.
Figure 6B:
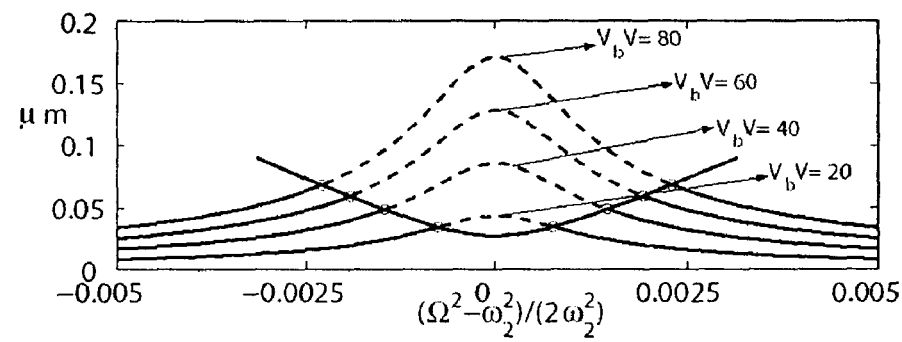
FIG. 6(b) is a graphical representation similar to FIG. 5(b), of the vertical displacement of the junction of the three beams of the T-beam structure when the second (higher frequency) mode is in primary resonance.

Similarly, FIG. 6 shows the response for the primary resonance of second mode. While FIG. 6(a) shows the transverse (horizontal) displacement of the tip of the upper beam 30, FIG. 6(b) shows the response of the junction of the three beams 26, 28 and 30. Interestingly, when the second mode is excited, the response of the first mode, and hence the tip of the upper beam 30, is non-zero only for a certain range of frequency, and thus the response in first mode performs a filtering action on the input signal. Further, in this case the first electrode 24 output signal is at half the input frequency and thus the resonator acts as a mixer (downconversion).

Figure 7A:
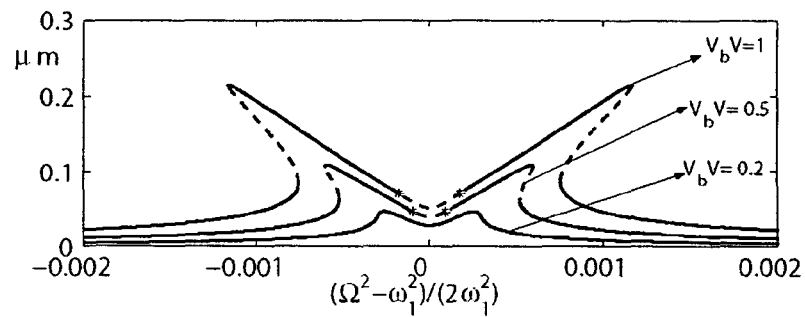
FIG. 7(a) is a graphical representation of the displacement of the upper tip of the vertical beam shown in FIG. 1 as a function of excitation frequency, where the first (lower frequency) mode is directly excited in primary resonance.
Figure 7B:
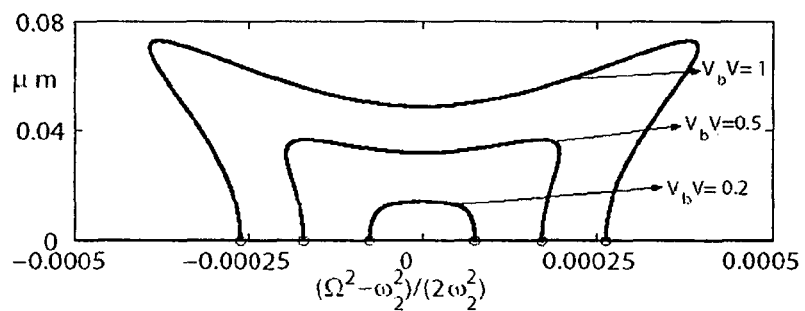
FIG. 7(b) is a graphical representation of the displacement similar to FIG. 7(a), when the second (higher frequency) mode is directly excited in primary resonance.

FIG. 7 depict the horizontal displacement of the tip of the upper beam 30. FIG. 7(a) shows the response in the first mode when the first mode is excited directly for a structure having a higher quality factor Q=5000 (achievable easily for micro resonators in vacuum, may be difficult in air). The response again undergoes Hopf bifurcation for higher voltages. The appearance of Hopf bifurcation depends on the strength of excitation in comparison to the structure damping. FIG. 7(b) shows the response in the first mode for the same structure when the second mode is in primary resonance, that is the structure is excited by the electrode 20. Since the two modes of the microresonator structure are assumed to be in perfect internal resonance, there is no Hopf bifurcation in the response of the system in FIG. 7(b). Further, the response changes appreciably with voltage when either of the modes are excited. This may limit the power handling capacity of such resonators.

The $\Gamma_j$ and other undefined variables in Lagrangian are defined below. These variables are constant with respect to time and are determined by the mode shapes of the structure.

$$\Gamma_j = \left(\sum_{i=1}^{3}\int_0^1 \frac{r_i v_i}{r_1 v_1}\phi_{ji}^2 d\bar{s}_i\right) + \left(\frac{r_3 v_3}{r_1 v_1}(1+R_t) + \right. \\ \left. R_c\left(1+\frac{r_2 v_2}{r_1 v_1}\right)\right)\phi_{j1}^2\bigg|_{s_1=1} + \frac{\gamma_c}{r_1 v_1^3}\left(\frac{\partial \phi_{j1}}{\partial \bar{s}_1}\right)^2\bigg|_{s_1=1} + \\ R_t \frac{r_3 v_3}{r_1 v_1}\phi_{j3}^2\bigg|_{s_3=1} + \frac{\gamma_t}{r_1 v_1^3}\left(\frac{v_1}{v_3}\right)^2\left(\frac{\partial \phi_{j3}}{\partial \bar{s}_3}\right)^2\bigg|_{s_3=1} \qquad (45)$$

$$\Gamma_{2+j} = \sum_{i=1}^{3}\int_0^1 \frac{\alpha_i v_1^3}{v_i^3 \alpha_1}\left(\frac{\partial^2 \phi_{ji}}{\partial \bar{s}_i^2}\right)^2 d\bar{s}_i \qquad (46)$$

where j=1 and 2. The $\Gamma_j$ and $\Gamma_{2+j}$ are dependent on the parameter s as the terms appearing in the above equations like $v_3/v_1$, $R_t$, $R_c$ are dependent on the ∈ as defined by the equations (31).

The other three terms $N_1$, $N_2$ and $\Gamma_f$ are also dependent on the mode shapes. These terms are as follows:

$$N_1 = \int_0^1 I d\bar{s}_3 \tag{47}$$

$$N_2 = I|_{\bar{s}_3=1} \tag{48}$$

$$\Gamma_{fj} = \int_{1-l_1}^1 \phi_{j1} d\bar{s}_1 + \frac{b_2 v_2}{b_1 v_1} \int_{1-l_2}^1 \phi_{j2} d\bar{s}_2, \; j = 1, 2, \tag{49}$$

$$\Gamma_{fk} = \frac{db_3 v_3}{d_3 b_1 v_1}\bigg|_{\varepsilon=0} \int_{1-l_3}^1 \phi_{k3} d\bar{s}_3, \; k = 3, 4, \tag{50}$$

where j=1,2, and $$I = \left\{ 2\frac{r_3}{r_1}\frac{v_3}{v_1}[(\eta_{111}|_{s_1=1}\phi_{23} - \eta_{121}|_{s_1=1}\phi_{13}) - \atop (\phi_{21}|_{s_1=1}\eta_{113} - \phi_{11}|_{s_1=1}\eta_{123})]\right\}\bigg|_{\varepsilon=0} \tag{51}$$

Figure 8:
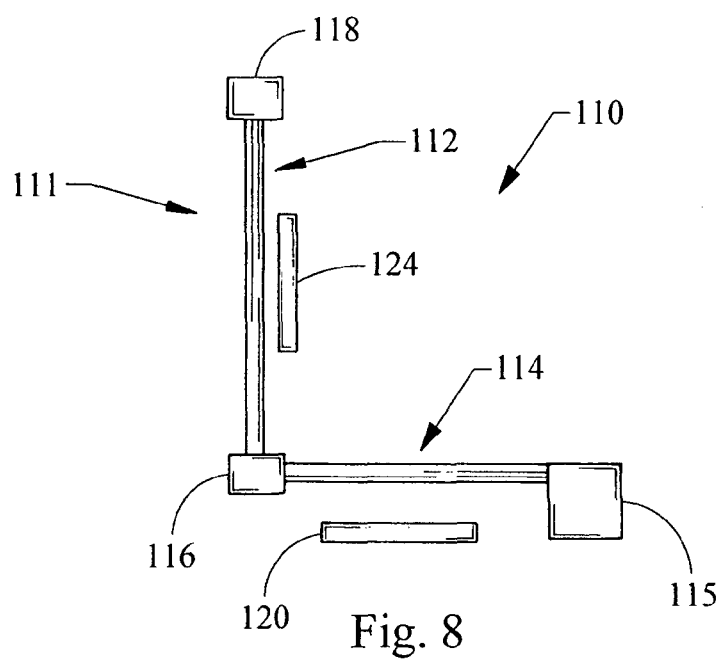
FIG. 8 is a plan view of a second embodiment of a micromechanical resonator embodying the principles of the present invention.

Referring now to FIG. 8, a second embodiment of the present invention is shown. The micromechanical resonator 110 includes a structure 111 having a first component 112 and a second component 114 generally defining an L-shaped configuration, where the second component 114 is connected to substrate 15. The resonator 110 further includes a first mass 116 connected to both components 112, 114, a second mass 118 connected to the free end of the first component 112, a first electrode 124 positioned adjacent to the first component 112, and a second electrode positioned adjacent to the second component 114. As with the resonator described above, the resonator embodies two modes, a lower natural frequency mode (the first mode) and a higher frequency mode (the second mode). The second mode, which may be induced by the second electrode 120, is embodied by both the first and second components 112, 114. Specifically, the second mode includes pivoting movement of the structure 111 about a point near the base 115. Additionally, the first mode, which also includes pivoting movement about the substrate 115, is embodied by both the first component 112 and the second component 114. As with the resonator 10 described above, the first mode is induced by the second mode through non-linear modal interaction. Due to the unsymmetrical nature of the structure 111, the first component 112 will move or flex parallel to the horizontal axis when the second component is deflecting or flexing along the vertical direction.

Figure 9:
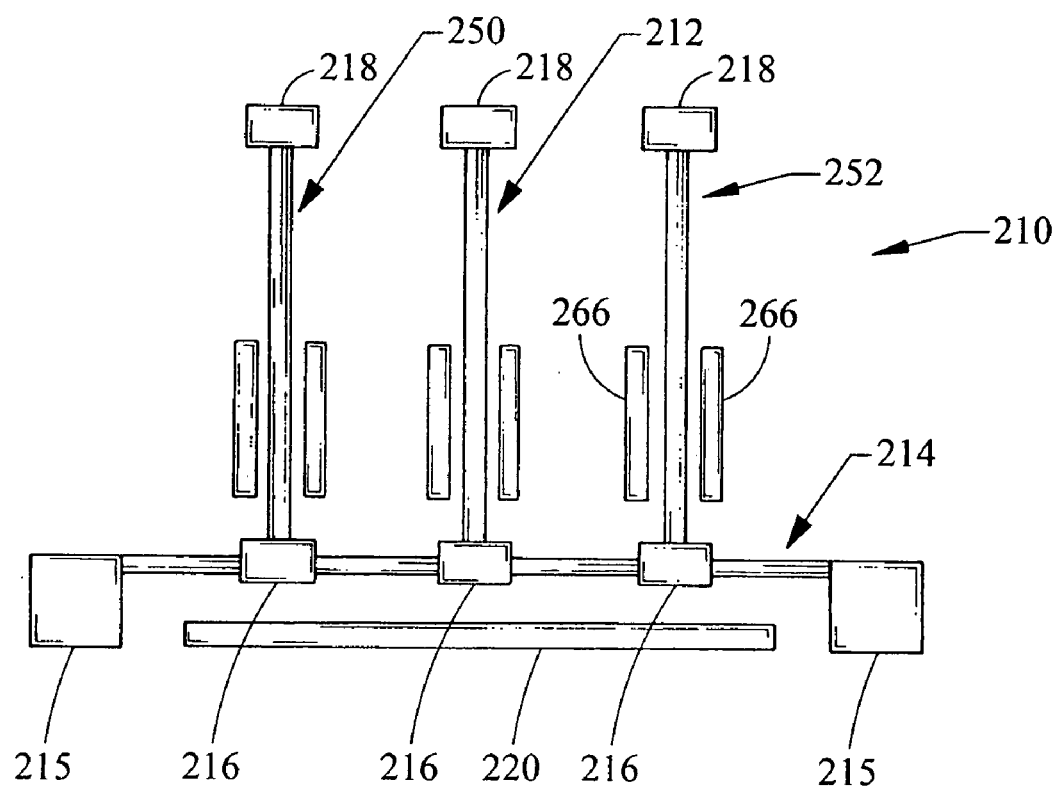
FIG. 9 is a plan view of a third embodiment of a micromechanical resonator embodying the principles of the present invention.

Referring now to FIG. 9, a third embodiment of the present invention is shown. The micromechanical resonator 210 includes a structure 111 having a second component 214 extending between two points on a base or substrate 215 and a first component 214, a third component 250 and a fourth component 252, each extending generally vertically from the second component such that the structure 111 generally defines an comb-shaped configuration. The resonator 110 further includes a plurality of first masses 116 connected to intersection points between the second component 214 and the perpendicular components 212, 250, 252. Additionally, the first component 214 includes an electrode 220 positioned adjacent thereto and each of the perpendicular components 212, 250, 252 includes a pair of electrodes 266 positioned on opposite sides thereof. The resonator 210 embodies a second mode including movement generally along the vertical axis and a first mode including movement generally along the horizontal axis. As with the resonator 10 described above, one of the modes may be induced by the electrode 220 or the pairs of electrodes 266 and the other mode is induced by non-linear internal resonance between the two modes. Also similarly to the resonator 10 described above, the first mode is non-linearly coupled with the second mode when the second component 214 is vibrating at a frequency twice the natural frequency of the first mode.

Utilizing principles discussed herein, a micromechanical resonator may be used to measure the mass of an object. For example, the response of a parametrically actuated structure shows a characteristic nonlinear phenomenon of a sudden jump in amplitude as the frequency of parameter variation is changed quasistatically. The sudden transition in amplitude at the jump frequency potentially results in an improved frequency resolution. When the shift in jump frequency is used to detect the mass, the better frequency resolution results in improving the resolution of detected mass.

Figures 10A, 10B:
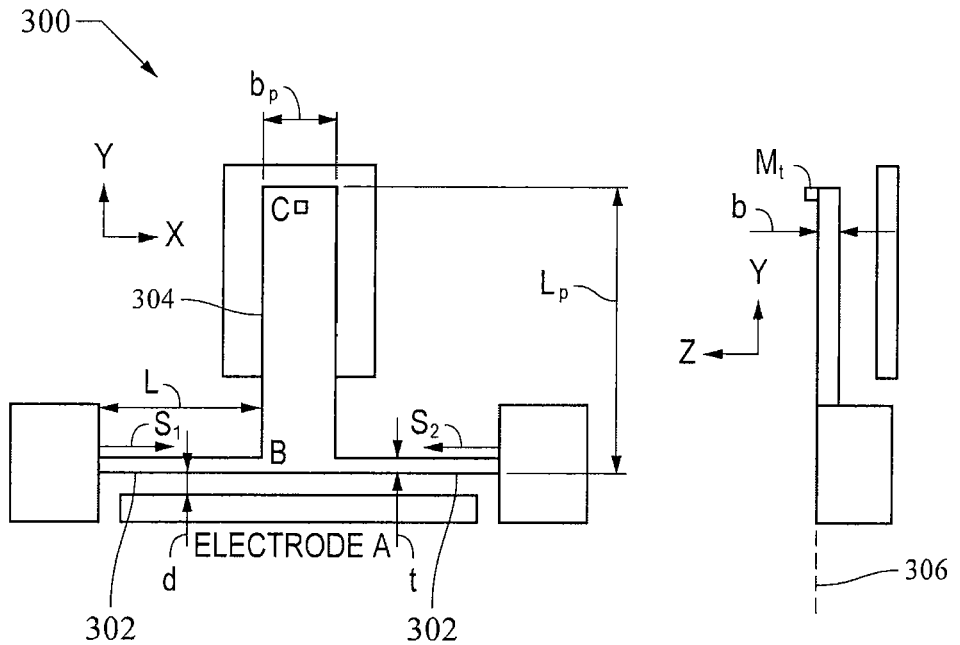
FIG. 10(a) is a schematic top view of a pedal microresonator embodying the principles of the present invention.
FIG. 10(b) is a schematic side view of the pedal microresonator shown in FIG. 10(a)

For example, referring to FIG. 10 a pedal shaped microresonator 300 is shown having torsional and flexural modes in 1:2 resonance for mass sensing. The pedal shaped microresonator 300 includes two beams 302 of equal length L that support a plate 304 (or pedal) of length $L_p$ and width $b_p$. As discussed below in more detail, the beams 302 define a flexural mode and the plate 304 defines a torsional mode. A mass particle $M_t$ to be sensed is placed in the middle of the tip of the plate 304. The beams 302 and the plate 304 shown in FIG. 10 each have a thickness 'b' and the beams have uniform rectangular cross-sections with beam lateral thickness t. The microresonator 300 is able to be resonantly excited through electrode A in an in-plane flexural mode with natural frequency f. When the flexural mode amplitude is above a threshold, this higher frequency flexural mode indirectly (autoparametrically) excites a torsional mode of the structure designed to have natural frequency f/2. The torsional mode results in an out-of-plane motion of the pedal with mass article to be sensed. For example, the flexural movement of the beams 302 is within a plane 306 (FIG. 10(b)) and the torsional movement of the plate 304 is substantially out of the plane 306. As a more specific example, a distal portion 304(a) of the plate 304 is a free end that moves in a direction (indicated by the z-axis in FIG. 10(b)) substantially normal to the plane 306. This coupling of flexural in-plane and torsional out-of-plane modes is characterized by quadratic nonlinearities, and the resonance between the modes is also referred to as autoparametric resonance.

Unlike some flexural-flexural structures, the flexural-torsional microresonator 300 causes the out-of-plane and in-plane responses to be uncoupled in linear response. Thus, the out-of-plane response is only able to arise due to nonlinear interaction.

The kinetic energy, T, and the potential energy, U, of the system shown in FIGS. 10(a) and 10(b) can be written as follows:

$$T = \sum_{i=1}^{2}\left(\frac{1}{2}\int_0^L m_b \dot{v}_i^2 ds_i + \frac{1}{24}\int_0^L m_b(b^2+r^2)\dot{\theta}_i^2 ds_i\right) + \tag{1}$$

$$\frac{1}{2}\bigg((M_p+M_t)\dot{v}_1^2 + (M_p(1+b^2/(4L_p^2))+3M_t)\frac{L_p^2}{3}\dot{\theta}_1^2 -$$

$$(M_p+2M_t)L_p\dot{v}_1\dot{\theta}_1\bigg)\bigg|_{s_1=L},$$

$$U = \sum_{i=1}^{2}\frac{1}{2}\int_0^L EIv_i''^2 ds_i + \frac{1}{2}\int_0^L GK\theta_i'^2 ds_i -$$

$$\frac{1}{2}\varepsilon_0 b(V_b + V\cos(\Omega\tau))^2 \times$$

$$\left(\frac{b_p}{d+(v_1|_{s_1=L})} + \sum_{i=1}^{2}\int_0^L \frac{1}{d+v_i}ds_i\right),$$

where $m_b$ is the beam mass per unit length, $M_p$ is the mass of the pedal structure, $v_i$ is the transverse displacement in Y direction of the i'th beam, $\theta_i$ is the angular displacement about the X axes of the i'th beam, and $v_i$ and $\theta_i$ are both functions of the i'th beam arc length $s_i$, EI is the flexural rigidity of the beam, G is the modulus of rigidity, and K is the Saint Venant torsion constant for non-circular cross-section. A prime denotes a derivative with respect to the appropriate arc length, and a dot denotes a derivative with respect to time, $\tau$. The last term in potential energy is associated with electrostatic actuation with V as the applied AC voltage with frequency $\Omega$, $V_b$ as the bias voltage, $\varepsilon_0$ as the permittivity of free space, and d as the gap between electrode 'A' and the structure. In deriving the electrostatic potential energy, the charge on the electrode and the movable structure is assumed to be constant. The system Lagrangian without the constraints can be defined as follows:

$$L = T - U. \tag{2}$$

The last term in the expression for kinetic energy T results in coupling the transverse and angular displacements in the equations of motion. These coupling terms in transverse and angular displacements are inertial quadratic nonlinearities and are sufficient to capture the performance of the system at the first-order approximation. Consequently, the warping, and the stretching nonlinearities leading to cubic nonlinear terms in the equations of motion are neglected. This formulation assumes that the initial out-of-plane curvature (Z axis) of the beam is close to zero. As a result, the flexural motion along the Z axis due to coupling in bending and twisting is of higher order. Also note that due to symmetry, the pedal will not displace along the X axis and it is assumed that the flexural motions of the two beams in XY plane are symmetrical so that the plate BC does not rotate about Z axis.

The structure model, in its linear approximation, allows two modes of vibration: the flexural motion of the beams in XY plane in which the pedal translates along the Y axis, and the torsional motion of the beams in which the pedal rotates out of the XY plane about the X axis. The exact mode shapes can be obtained by a linear analysis; however, as the pedal mass is far greater than the beam mass, the fundamental mode shape for torsional motion, denoted by $\Psi_i(s_i)$, of the slender beams can be approximated as a linear function, and the motion of the beam in the lowest in-plane flexural mode can be approximated by the first mode of a clamped-clamped beam. The normalized flexural mode shape is denoted by $\phi_i(s_i)$, $i=1, 2$, and is defined through an intermediate corresponding variable $\bar{\phi}_i(s_i)$. The mode shapes are as follows:

$$\Psi_i(s_i) = s_i/L, \tag{3}$$

$$\bar{\phi}_i(s_i) = (\cosh(\beta s_i) - \cos(\beta s_i)) +$$

$$\frac{\cos(2\beta L) - \cosh(2\beta L)}{\sinh(2\beta L) - \sin(2\beta L)}(\sinh(\beta s_i) - \sin(\beta s_i)),$$

$$\phi_i(s_i) = \sqrt{\frac{L}{\int_0^L \bar{\phi}_i^2 ds_i}}\,\bar{\phi}_i(s_i),$$

where $i=1,2$, $(2\beta L)=4.733$, and $0 \leq s_i \leq L$.

Using the approximated mode shapes, the natural frequencies of the torsional mode, $\omega_1$, and the flexural mode, $\omega_2$, are as follows:

$$\omega_1 = \sqrt{\frac{2KG}{I_T L}},\ \omega_2 = \sqrt{\frac{62.570 EI}{M_F L^3}}, \tag{4}$$

where the torsional inertia $I_T$ and the flexural mass $M_F$ are given by the following:

$$I_T = m_b L(r^2+b^2)/18 + (M_p(1+b^2/(4L_p^2))+3M_t)L_p^2/3,$$

$$M_F = 2m_b L + 2.522(M_p+M_t). \tag{5}$$

Note that the dimensions of the resonator can be chosen such that the two frequencies satisfy $\omega_2 = 2\omega_1$.

In the presence of damping, the modes not excited directly or indirectly through internal resonance are expected to decay. Thus, the steady-state response of the microresonator can be assumed to be a modal expansion of the directly excited and interacting modes:

$$\theta_i = \Psi_i A_1(\tau), v_i = \phi_i A_2(\tau), \tag{6}$$

where $i=1,2$, and $A_1$ and $A_2$ are functions of time that represent the torsional and flexural modal amplitudes, respectively. Using the above modal expansion, equation (6), for the transverse and angular displacements in Lagrangian (2), the following Lagrange's equations give the two mode nonlinear model of the system:

$$\ddot{A}_1 + 2\zeta_1\omega_1\dot{A}_1 + \omega_1^2 A_1 = \frac{\Lambda}{I_T}A_1\ddot{A}_2, \tag{7}$$

$$\ddot{A}_2 + 2\zeta_2\omega_2\dot{A}_2 + \omega_2^2 A_2 = \frac{\Lambda}{M_F}(\dot{A}_1^2 + A_1\ddot{A}_1) -$$

$$\frac{F}{M_F}(f_0 - 2f_1 A_2 + 3f_2 A_2^2),$$

where $$\Lambda = \phi(L)(M_p + 2M_t)/(2L_p),\ \phi(L) = 0.7937, \tag{8}$$

$$f_0 = 1.5873 b_p + 1.6619L,\ f_1 = (2.5198 b_p + 2L)/d,$$

$$f_2 = (4b_p + 2.6583L)/d^2,$$

$$F = F_0 + F_1\cos(\Omega\tau) + F_2\cos(2\Omega\tau),$$

$$[F_0, F_1, F_2]^T = \frac{1}{2}\frac{\varepsilon_0 b}{d^2}[(V_b^2 + 0.5V^2),\ 2V_b V,\ 0.5V^2]^T.$$

Here, $\zeta_1$ and $\zeta_2$ are the modal dampings in the torsional and the flexural displacements respectively. $\Lambda$ is the coefficient of inertial quadratic nonlinearities, and (F, $f_0$, $f_1$, $f_2$) variables are for the electrostatic actuation terms. Further, the actuation term F as given in equation (8) consists of time independent bias voltage term $F_0$, and harmonic terms with amplitudes $F_1$ and $F_2$ with frequencies $\Omega$ and $2\Omega$ respectively. Terms up to quadratic nonlinearities (structural and actuation) are retained in this model.

Static equilibrium equations can be obtained by setting the time derivative and time varying terms to zero in equations of motion (7), as follows:

$$A_{10} = 0, \quad \omega_2^2 A_{20} = -\frac{F}{M_F}(f_0 - 2f_1 A_{20} - 3f_2 A_{20}^2), \tag{9}$$

where $A_{10}$ and $A_{20}$ are the static equilibrium amplitudes for the torsional and the flexural modes, respectively. $A_{20}$ can be approximated by a power series expansion in $F_0$, resulting in the following relation:

$$A_{20} = -\frac{F_0 f_0}{M_F \omega_2^2}\left(1 + \frac{2F_0 f_1}{M_F \omega_2^2}\right) + O(F_0^3). \tag{10}$$

The total response of the resonator comprises of the static deflection and the time dependent displacement about the static equilibrium. Further, to order the various linear and nonlinear terms in the equations of motion, we scale the time dependent angular and transverse displacement amplitudes using a dimensionless parameter $\in$, with $0 < \in \ll 1$, as follows:

$$A_1 = \in \alpha_1(\tau), \quad A_2 = A_{20} + \in \alpha_2(\tau). \tag{11}$$

We also scale the modal dampings and actuation forces using the same dimensionless parameter $\in$, as follows:

$$F_0 = \in \hat{F}_0, \quad \zeta_i = \in \hat{\zeta}_i, \quad F_i = \in^2 \hat{F}_i, \tag{12}$$

with i=1,2. Substituting equations (11) and (12) in the equations of motion and using the static equilibrium position (10), the resulting equations of motion in terms of the scaled parameters are as follows:

$$\ddot{a}_1 + 2\zeta_1 \omega_1 \dot{a}_1 + \omega_1^2 a_1 = \varepsilon \frac{\Lambda}{I_T}(a_1 a_2) + O(\varepsilon^2), \tag{13}$$

$$\ddot{a}_2 + 2\hat{\zeta}_2 \omega_2 \dot{a}_2 + \omega_2^2 a_2 = \varepsilon\left(\frac{\Lambda}{M_F}(\dot{a}_1^2 + a_1 \ddot{a}_1) + 2\frac{f_1}{M_F}\hat{F}_0 a_2 - \frac{f_0}{M_F}(\hat{F}_1 \cos(\Omega \tau) + \hat{F}_2 \cos(2\Omega \tau))\right) + O(\varepsilon^2).$$

Note that the terms associated with bias voltage $\hat{F}_0$ in the equation of motion for amplitude $\alpha_2$ results in decreasing the natural frequency of the flexural mode. The modified natural frequency of the natural mode, $\bar{\omega}_2$, is as follows:

$$\bar{\omega}_2 = \omega_2\left(1 - \varepsilon \frac{f_1}{M_F \omega_2^2} \hat{F}_0 a_2\right). \tag{14}$$

The method of averaging is then applied to obtain asymptotic amplitude and phase equations that govern the response of the system on slow time scale. For example, the following transformations may be used:

$$a_1 = P\cos(\Omega \tau/2 - \beta_1), \quad \dot{a}_1 = -\frac{1}{2}P\Omega\sin(\Omega \tau/2 - \beta_1) \tag{15}$$
$$a_2 = Q\cos(\Omega \tau - \beta_2), \quad \dot{a}_2 = -Q\Omega\sin(\Omega \tau - \beta_2),$$

where P and Q represent the amplitudes of the torsional and the flexural modes, and are functions of slow time scale $\in \tau$. $\beta_1$ and $\beta_2$ are the corresponding phases of the amplitudes P and Q respectively, and are also functions of slow time scale $\in \tau$. Following the method of averaging procedure, the following asymptotic equations are obtained:

$$\left. \begin{array}{l} P' = -\omega_1 \zeta_1 P - \dfrac{\Lambda}{2I_T} PQ\Omega\sin(2\beta_1 - \beta_2), \\[6pt] P\beta_1' = \dfrac{1}{2}(\Delta\Omega + \Delta\omega)P - \dfrac{\Lambda}{2I_T} PQ\Omega\cos(2\beta_1 - \beta_2), \\[6pt] Q' = -\omega_2 \zeta_2 Q + \dfrac{\Lambda}{8M_F}\Omega P^2 \sin(2\beta_1 - \beta_2) - \dfrac{F_1 f_0}{2M_F \Omega}\sin\beta_2, \\[6pt] Q\beta_2' = \Delta\Omega Q - \dfrac{\Lambda}{8M_F}\Omega P^2 \cos(2\beta_1 - \beta_2) - \dfrac{F_1 f_0}{2M_F \Omega}\cos\beta_2, \end{array} \right\} \tag{16}$$

where a prime now denotes derivative with respect to slow time $\in \tau$. $\Delta\Omega$ and $\Delta\omega$ denote mistunings from external resonance of the flexural mode and 1:2 internal resonance, respectively, and are defined as follows:

$$\Delta\Omega = (\Omega - \bar{\omega}_2)/\in, \quad \Delta\omega = (\bar{\omega}_2 - 2\omega_1)/\in. \tag{17}$$

Analysis of averaged equations (16) for steady-state solution gives two types of solutions. First type is the semi-trivial linear solution where the directly excited flexural mode's response amplitude is non-zero ($Q\neq 0$) and the torsional mode does not participate in the response (P=0). When the actuation strength is greater than a certain threshold, the semi-trivial solution (P=0, $Q\neq 0$) becomes unstable resulting in the second type of solution where both the modes participate ($P\neq 0, Q\neq 0$). The solution where both the modes participate is possible only due to nonlinear interaction between the modes with 1:2 internal resonance. The threshold actuation level required to indirectly excite the torsional mode can be obtained by stability analysis of the averaged equations, and is given by the following:

$$(V_b V)_{th} = \frac{2d^2 M_F I_T}{\varepsilon_0 b f_0 \Lambda}\sqrt{((\Delta\Omega)^2 + \zeta_2^2 \omega_2^2)((\Delta\Omega + \Delta\omega)^2 + 4\zeta_1^2 \omega_1^2)}. \tag{18}$$

The coupled-mode equilibrium solution for a general system with quadratic nonlinearities and 1:2 internal resonance is known to undergo Hopf-bifurcation to limit cycle oscillations. Eventually, for some parameter combinations (and small damping), the limit cycles can lead to chaos by period-doubling bifurcations.

To illustrate an exemplary response of the resonator 300 shown in FIGS. 10(a) and 10(b), with and without added mass, the following values are first assumed: L=100 µm, t=3 µm, b=5 µm, $L_P$=105 µm, $b_p$=25 µm, d=2 µm. The resonator is assumed to be made of polysilicon, with material properties assumed to be: Young's modulus E=170 GPa, density $\rho$=2330 kg/m³, and Poisson's ratio v=0.20. Assuming negligible residual stresses from the fabrication process, the resonator's torsional and flexural natural frequencies using equation (4)

are 94.845 kHz and 189.830 kHz. The two interacting mode shapes are shown in the inset in FIG. 12. The natural frequencies can be more finely tuned to 1:2 resonance post fabrication using electrostatic bias voltage, post fabrication laser trimming, or by attaching commercially available nano-particles on the resonator. Since the flexural mode frequency with no electrostatic bias voltage is larger than two times the torsional mode natural frequency, the electrostatic bias voltage can be used to tune the resonator. From equations (14) and (8), the applied voltages should satisfy:

$$(V_b^2 + 0.5V^2) = 2\frac{d^2}{\varepsilon_0 b f_1}(\omega_2 - 2\omega_1)\omega_2 M_F. \quad (19)$$

When there is no varying voltage applied, V=0, the required bias voltage for tuning the frequencies in perfect 1:2 resonance is 11 Volts.

Damping can be reduced by operating the microresonator in vacuum. Simulation results for different damping values, which represent the operation of resonator in vacuum, are as follows: (Q in few thousands) to air (Q in few hundreds), and possibly in liquid (Q in tens).

Figure 12A:
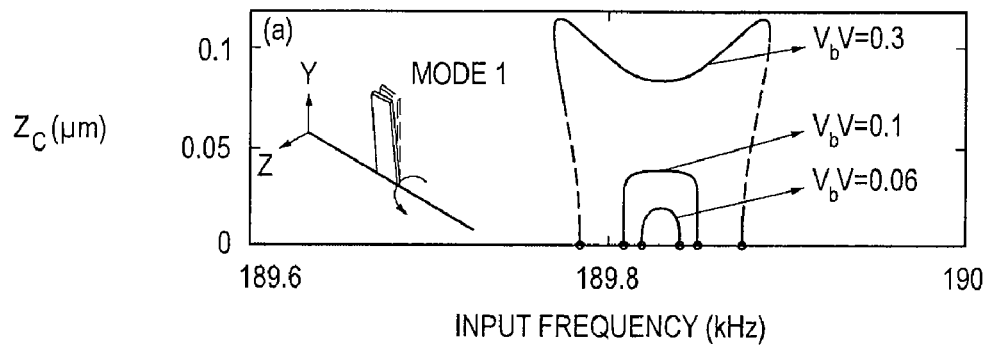
FIG. 12(a) is a graphical representation of mode 1 of a nonlinear microresonator embodying the principles of the present invention.
Figure 12B:
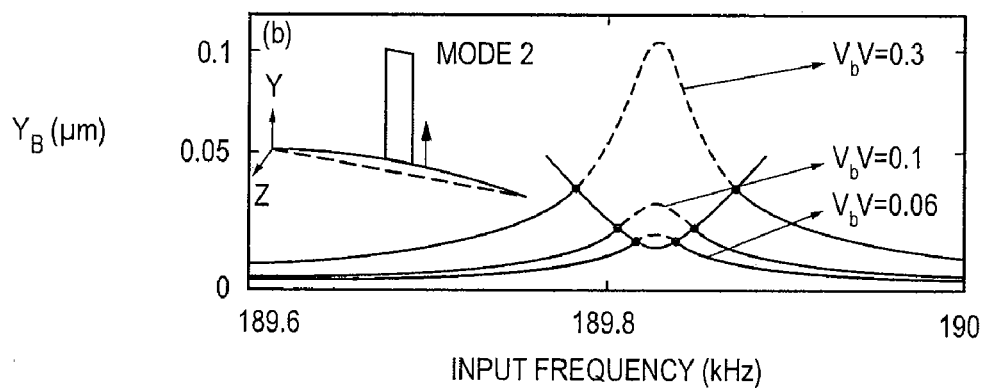
FIG. 12(b) is a graphical representation of mode 2 of the nonlinear microresonator shown in FIG. 12(a)

FIGS. 12(a) and 12(b) illustrate the response of a nonlinear resonator when excited resonantly in the in-plane flexural mode for various actuation voltages ($V_b V$ in (Volt)$^2$). FIG. 12(a) illustrates the out-of-plane displacement ($Z_C$) at the tip of the plate 304. FIG. 12(b) illustrates the in-plane displacement ($Y_B$) of the plate 304.

The response in FIG. 12 shows the out-of-plane displacement at the tip of the plate 304 ($Z_C$) and the transverse (in-plane) displacement of the plate 304 ($Y_B$) when the resonator 300 is actuated electrostatically, $M_t$=0, and the modes are in 1:2 resonance. The damping level for both the modes are set to $\zeta_1=\zeta_2=0.0001$, that is, Q=5000 for both the modes. Up to a threshold actuation level ($V_b V$=0.05(Volt)$^2$ for this design using equation (18)), the structure responds linearly with the plate 304 having only an in-plane transverse displacement; however, when the threshold voltage is exceeded, the in-plane flexural motion becomes unstable (indicated by dotted lines) and a new stable response arises due to pitchfork bifurcation. In this stable response, the nonlinear interaction between the flexural mode and the torsional mode results in an out-of-plane rotation of the plate 304 at half the input frequency due to the participation of the torsional mode in the response. Thus, the out-of-plane response will be zero unless the torsional mode participates. As can be seen, the indirectly excited mode responds only in a small frequency interval around the directly excited resonant frequency. Also note that the output response is at half the input frequency.

Figure 13:
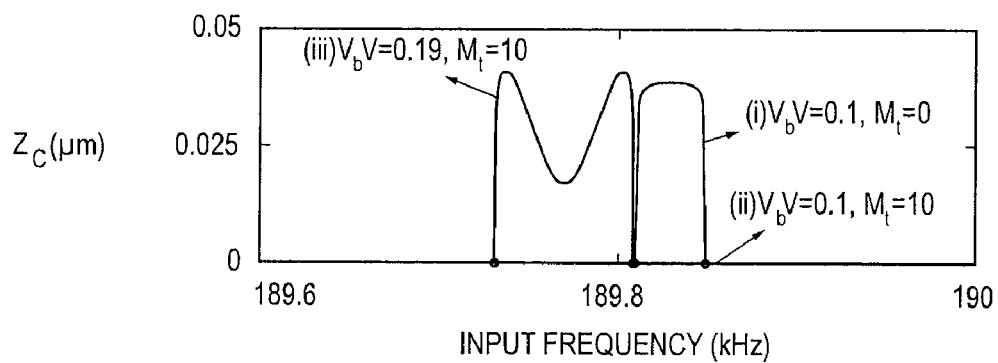
FIG. 13 is a graphical representation of a pedal tip out-of-plane response for two voltage levels.

FIG. 13 illustrates the out-of-plane response ($Z_C$) for the tip of the plate 304 for two voltage levels: $V_b V$=0.1 and 0.19 (Volts)$^2$. FIG. 13 shows the response of the 1:2 tuned resonator with mass $M_t$=10 picogm (about 0.01% of the total resonator mass). With no mass on the plate 304, the out-of-plane response is non-zero for $V_b V$=0.1(Volt)$^2$. However, additional mass $M_t$=10 picogm shifts the natural frequencies which result in mistuning the resonator away from 1:2 resonance. Mistuning results in increasing the threshold actuation level to $V_b V$=0.16(Volt)$^2$ for this design. As a result, the torsional mode is not excited, and $Z_C$ remains zero. The voltage level $V_b V$ needs to be approximately doubled to resume the same amplitude of plate 304 tip displacement ($Z_C$).

Figure 14:
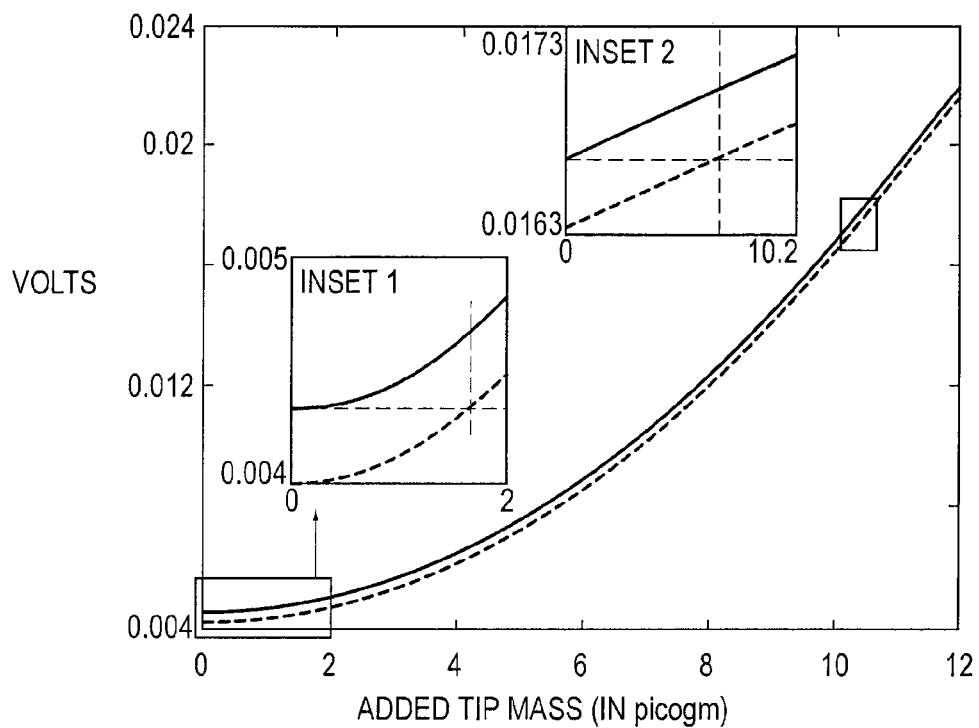
FIG. 14 is a graphical representation of the voltage required to have pedal tip amplitude of 10 nm as a function of added mass.

The minimum mass required to stop the out-of-plane response in a perfectly tuned system depends primarily on the amplitude of the displacement before the mass is placed at the plate 304 tip. The solid line in FIG. 14 shows the AC voltage required to maintain a specified value of pedal tip displacement $Z_C$ (here 10 nm) as a function of the added tip mass. The quality factor of both the modes are still kept at 5000, and the bias voltage is set to a value that tunes the two modes in perfect 1:2 internal resonance (here $V_b$=11 Volts). Since the AC voltage is much smaller than the bias voltage the mistuning is entirely due to the added mass. The slope of the voltage-added mass curve increases as the added mass increases.

Figures 11A, 11B:
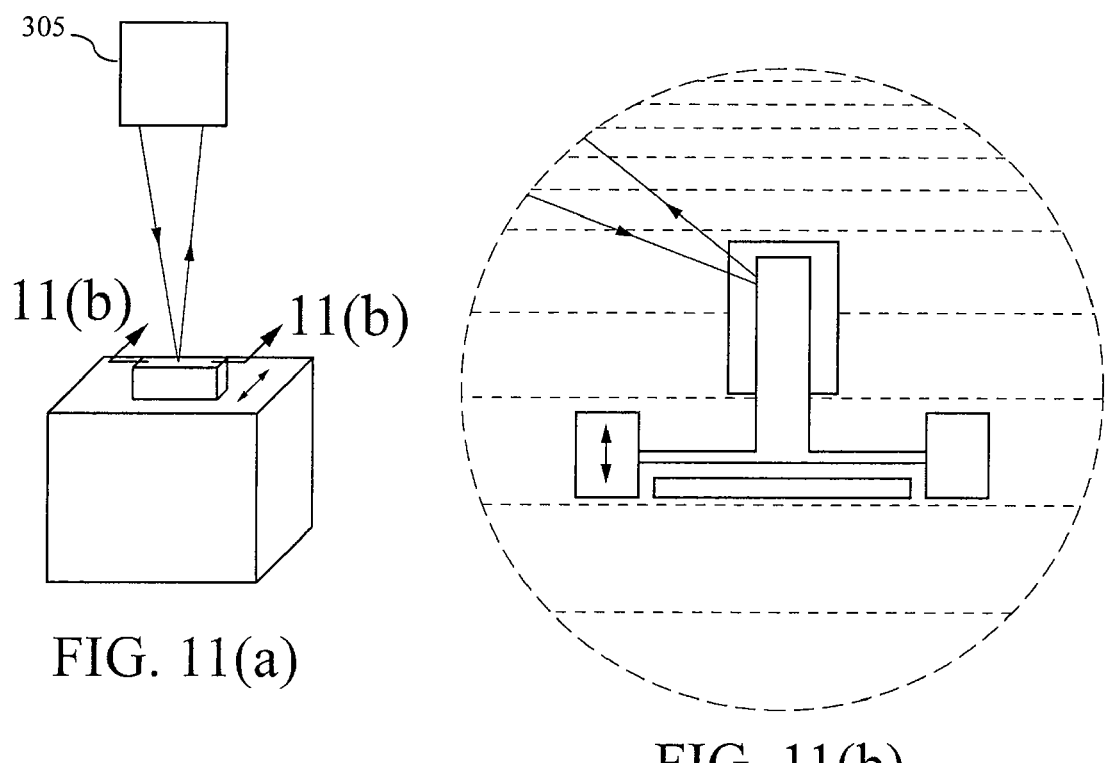
FIG. 11(a) is a schematic representation of pedal microresonator embodying the principles of the present invention and being utilized with a liquid sample.
FIG. 11(b) is a magnified view of the pedal microresonator shown in FIG. 11(a)

FIG. 14 shows the required threshold AC voltage, in a dashed line, required to get any response for the given added mass. The threshold voltage and specified tip displacement voltages are calculated for $\Delta\Omega$ (or the input frequency $\Omega$) for which the required threshold voltage is minimum. The internal mistuning $\Delta\omega$ can be obtained using equation (17) for the given added mass. The value of $\Delta\Omega$ for minimum threshold voltage depends on damping values, and for equal damping coefficients in both the modes $\Delta\Omega=-0.5\Delta\omega$. In practice, the voltage can be increased in steps of 10 μVolts and input frequency can be swept to observe any change in the plate 304 tip displacement $Z_C$. The specified tip displacement of 10 nm can be measured by a laser vibrometer 305 (FIG. 11(a)) and is much larger than the rms thermal deflection amplitude of 0.05 nm at 300 K for 30 nanogm mass of the resonator in this example.

Also, the minimum mass required to stop pedal tip oscillating with amplitude 10 nm with no mass is about 1.5 picogm. However, if we start with a system that already has a mass of 10 picogm on the pedal, even a change in mass of 0.15 picogm can stop the out of plane motion with $Z_C$=10 nm. If the plate 304 tip amplitude for no mass and with 10 picogm mass is 5 nm, the corresponding minimum masses decrease to 0.8 picogm and 0.04 picogm, respectively. Thus, utilizing the steeper slope region of the voltage-added mass curve, mass in the femto gram range can be measured. The minimum masses required to affect such change remains unchanged regardless of the quality factor. Only the threshold voltage or power required to indirectly excite the out-of-plane motion increases with quality factor. However, the steeper curve can be utilized better in the low quality factor environment, as quadratically coupled oscillators with low damping values require larger mistuning to cause Hopf-bifurcation and consequent complex dynamics.

Figure 15:
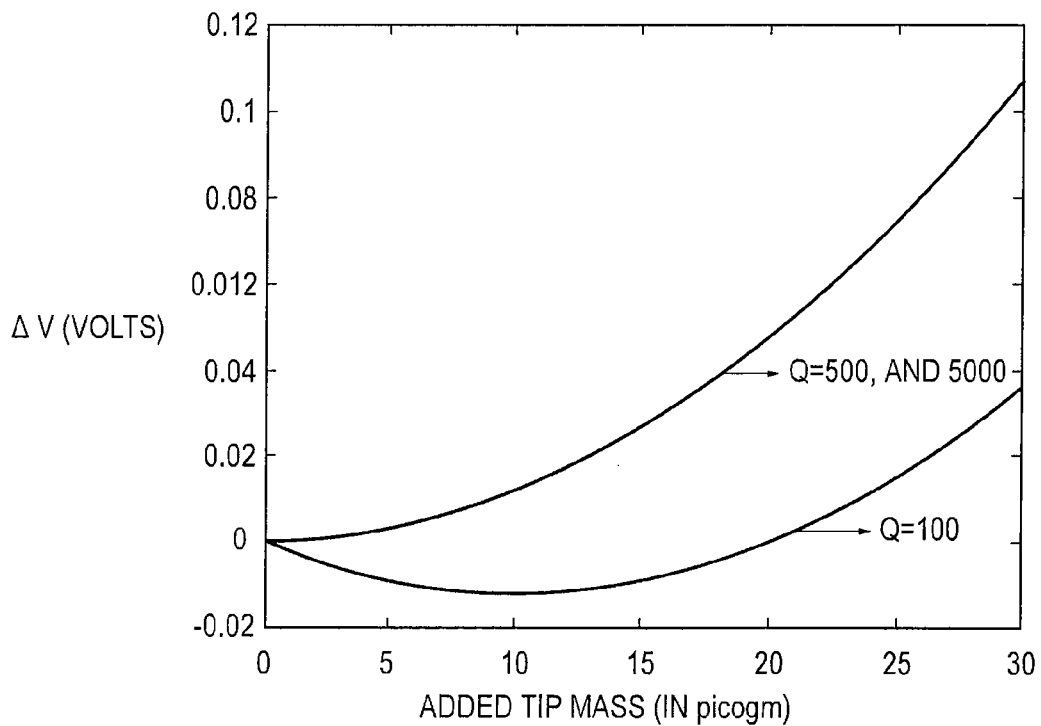
FIG. 15 is a graphical representation of the difference between theca voltage required to set pedal tip amplitude $Z_c$ of 10 nm with the added mass and without the added mass.

The difference between the AC voltage required to set pedal tip amplitude $Z_C$ of 10 nm with the added mass and without the added mass, denoted by $\Delta V$, is plotted in FIG. 15 for three quality factors viz Q=100, 500, and 5000. Both the modes are assumed to have the same quality factor. The voltage difference $\Delta V$ almost overlaps for Q=500 and 5000. In the case of Q=100, the threshold voltage (10.5 Volts) is comparable to the bias voltage (11V), and it is not possible to set a bias voltage that can satisfy both the minimum threshold voltage requirement, equation (18), and the frequency tuning requirement, equation (19). As a result, the resonator is mistuned for zero added mass, and the added mass rather helps in tuning the resonator and the voltage required to achieve 10 nm pedal tip displacement decreases. The added mass till the $\Delta V$<0 should be thought of as the initial mass or other mechanism required to tune the resonator modes in 1:2 internal resonance. In this example, for Q=100 the resonator is tuned to 1:2 internal resonance with added mass of 10 picogm. Thus, the resonator use in a low quality factor environment may require tuning the 1:2 internal resonance using added mass, and can function equally well in both a low quality factor environment and in vacuum. However, lower quality factor results in increasing the threshold AC voltage, which can increase the possibility of dynamic pull-in instability in addition to the static pull-in stability.

As a result of the above-discussed advantages of the present invention, the micromechanical resonator 300 is able to operate effectively in any medium, such as air, fluid, or a vacuum. For example, the 1:2 resonance between the first and second modes and the mass sensitivity is substantially completely maintained, regardless of a medium in which the micromechanical resonator is located. Therefore, the pedal microresonator design utilizing nonlinear interaction between 1:2 internally resonant flexural and torsional modes can be used as a highly sensitive mass sensor. The shift in natural frequencies due to mass perturbation mistunes the 1:2 internal resonance, and thereby increases the threshold voltage level required to activate the torsional mode. The out-of-plane response can even be switched 'off' if the applied voltage level with no mass is lower than the new threshold voltage level as shown in the example results. Thus, instead of frequency shift, a measure for mass estimate can be the increase in voltage level required to achieve the same out-of-plane plate tip displacement amplitude as the amplitude prior to the addition of mass. Simulation results predict measurement of sub picogm mass with a micro sized resonator with fundamental frequency below 100 kHz. The resonator performance remains independent of the quality factor except for the higher voltages required to indirectly excite the torsional mode.

It is therefore intended that the foregoing detailed description be regarded as illustrative rather than limiting, and that it be understood that it is the following claims, including all equivalents, that are intended to define the spirit and scope of this invention.

What is claimed is:

1. A micromechanical resonator comprising:
   an actuator configured to provide an excitation;
   a second component configured to move within a plane at a second frequency in response to the excitation of the actuator; and
   a first component non-linearly coupled with the second component such that the movement of the second component at the second frequency induces resonant excitation of the first component that is substantially completely out of the plane;
   wherein the movement of the second component at the second frequency induces the resonant excitation of the first component at a first frequency that is approximately one half of the second frequency such that the first and second components have a 1:2 resonance and wherein the 1:2 resonance between the first and second components and mass sensitivity is substantially completely maintained, regardless of a medium in which the micromechanical resonator is located.

2. A micromechanical resonator as in claim 1, wherein the second component is a beam and the first component is a plate having a proximal portion connected to the beam and a distal portion that is a free end.

3. A micromechanical resonator as in claim 2, wherein the free end of the first component moves in a direction substantially normal to the plane during the resonant excitation of the first component.

4. A micromechanical resonator as in claim 2, wherein the beam includes a pair of beam portions positioned on opposite sides of the plate.

5. A micromechanical resonator as in claim 2, wherein the beam cooperates with the plate to define a generally T-shaped structure.

6. A micromechanical resonator as in claim 1, configured for use as a mass sensor for determining the mass of an object.

7. A micromechanical resonator comprising:
   a structure having a first component and a second component; and
   an actuator configured to induce movement of the second component at a second frequency and substantially completely within a plane;
   wherein the first component is non-linearly coupled to the second component such that the movement of the second component at the second frequency induces resonant excitation of the first component that is substantially completely out of the plane;
   wherein the movement of the second component at the second frequency induces the resonant excitation of the first component at a first frequency that is approximately one half of the second frequency such that the first and second components have a 1:2 resonance and wherein the 1:2 resonance between the first and second components and mass sensitivity is substantially completely maintained, regardless of a medium in which the micromechanical resonator is located.

8. A micromechanical resonator as in claim 7, wherein the second component is a beam and the first component is a plate having a proximal portion connected to the beam and a distal portion that is a free end.

9. A micromechanical resonator as in claim 8, wherein the free end of the first component moves in a direction substantially normal to the plane during the resonant excitation of the first component.

10. A micromechanical resonator as in claim 8, wherein the beam includes a pair of beam portions positioned on opposite sides of the plate.

11. A micromechanical resonator as in claim 8, wherein the beam cooperates with the plate to define a generally T-shaped structure.

12. A micromechanical resonator as in claim 7, configured for use as a mass sensor for determining the mass of an object.

13. A mass sensor for determining the mass of an object, comprising:
   a micromechanical resonator including a structure having a first component, a second component, and an actuator configured to induce movement of the second component at a second frequency and substantially completely within a plane, wherein the first component is configured to receive the object, and wherein the first component is non-linearly coupled to the second component such that the movement of the second component at the second frequency induces resonant excitation of the first component substantially completely out of the plane; and
   a measurement device for detecting the resonant excitation of the first component to determine the mass of the object.

14. A mass sensor as in claim 13, wherein the movement of the second component at the second frequency induces the resonant excitation of the first component at a first frequency that is approximately one half of the second frequency such that the first and second components have a 1:2 resonance.

15. A mass sensor as in claim 14, wherein the 1:2 resonance between the first and second components is substantially completely maintained, regardless of a medium in which the micromechanical resonator is located.

16. A mass sensor as in claim 13, wherein the measurement device for detecting the resonant excitation of the first component is a laser vibrometer.

* * * * *